(12) United States Patent
Fujimura

(10) Patent No.: US 7,984,414 B2
(45) Date of Patent: Jul. 19, 2011

(54) PRINTED CIRCUIT BOARD DESIGN SUPPORT APPARATUS, METHOD, AND RECORDING MEDIUM STORING PROGRAM THEREFOR

(75) Inventor: Kouji Fujimura, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/978,767

(22) Filed: Dec. 27, 2010

(65) Prior Publication Data

US 2011/0093832 A1 Apr. 21, 2011

Related U.S. Application Data

(62) Division of application No. 11/448,960, filed on Jun. 6, 2006, now Pat. No. 7,886,249.

(30) Foreign Application Priority Data

Jun. 9, 2005 (JP) .................................. 2005-169581

(51) Int. Cl.
*G06F 17/50* (2006.01)
(52) U.S. Cl. .......... 716/137; 716/52; 716/111; 716/126; 716/136; 716/139; 702/57
(58) Field of Classification Search ............... 716/52, 716/111, 126, 136, 137, 139; 702/57
See application file for complete search history.

(56) References Cited

U.S. PATENT DOCUMENTS

| | | | |
|---|---|---|---|
| 6,266,389 B1 | 7/2001 | Murayama et al. | |
| 6,839,885 B2 * | 1/2005 | Ahrikencheikh | 716/122 |
| 7,031,853 B2 * | 4/2006 | Kageura | 702/57 |
| 2004/0254749 A1 | 12/2004 | Kageura | |
| 2005/0138592 A1 | 6/2005 | Morgan et al. | |

FOREIGN PATENT DOCUMENTS

JP 2005-10835 1/2005

* cited by examiner

*Primary Examiner* — Paul Dinh
*Assistant Examiner* — Nha T Nguyen
(74) *Attorney, Agent, or Firm* — Greer, Burns & Crain, Ltd.

(57) ABSTRACT

In designing a printed circuit board, first and second copies of views of first and second major surfaces of the board respectively, are created. The first and second copies are positioned to contact each other. First and second segments on a side of the printed circuit board and normal to a first element in the first copy and a second element in the second copy respectively are obtained. A third segment joining ends of the first and second segments is obtained, and a point dividing the third segment according to a ratio of a distance from the first element to the side and a distance from the second element to the side is calculated. Distances from the first element to the point and from the point to the second element are calculated, and a creepage distance, a sum of the two distances and a thickness of the board, is obtained.

2 Claims, 22 Drawing Sheets

FIG. 2A

Common information 310

| Thickness of board 312 | Allowable distance 314 | Attribution of storing data 316 |
|---|---|---|
| 0.2mm | 1.0mm | Class 100 |

FIG. 2B

Data on the board measured 320

| Identification code 322 | Identification of Shape/Hole 324 | Shape data of board 326 |
|---|---|---|
| ID 1 | Contour shape | Segment data of side 1 |
| ID 1 | Contour shape | Segment data of side 2 |
| ID 1 | Contour shape | Segment data of side 3 |
| ID 1 | Contour shape | Segment data of side 4 |
| ID 2 | Hole | Segment data of side 1 |
| ... | ... | ... |

FIG. 2C

Information of the element on the front surface of board related to one side of the board 330

| Identification code of element on the front surface 332 | Identification code of the element mirrored copy 334 | Net circuit name 336 | Shape data of the element mirrored copy 338 |
|---|---|---|---|
| ID A | ID a | SIGNAL A | Shape data of the element |
| ID B | ID b | SIGNAL B | Shape data of the element |
| ... | ... | ... | ... |

Information of the element mounted on the rear surface of the board retrieved by the shape mirroring copy 340

| Identification code of the element mounted on the rear surface 342 | Circuit net name 344 | Shape data of the element 346 |
|---|---|---|
| ID C | SIGNAL C | Figure data of the element |
| ID C | SIGNAL D | Figure data of the element |
| ... | ... | ... |

FIG. 2D

Information of resultant measures _350_

| Identification code of the element mounted on the front surface _352_ | Identification code of the element mounted on the back surface _354_ | Calculated creepage distance _356_ | Path information _358_ |
|---|---|---|---|
| ID A | ID C | 0.8 mm | Figure data of measuring path |
| ID B | ID D | 0.5 mm | Figure data of measuring path |
| ... | ... | ... | ... |

FIG. 2E

Figure information of measuring route _360_

| Identification code of starting point element (non-dispaly data) _362_ | Identification code of terminal element (non-display data) _364_ | Geometrical data of path (display data) _366_ |
|---|---|---|
| | | Segmented figure data in three coordenates |
| ID A | ID C | |

FIG. 2F

Creepage distance=LA+LB+LC

PRINTED CIRCUIT BOARD DESIGN SUPPORT APPARATUS, METHOD, AND RECORDING MEDIUM STORING PROGRAM THEREFOR

This is a divisional of application Ser. No. 11/448,960, filed Jun. 6, 2006.

BACKGROUND OF THE INVENTION

1. Field of the Invention

The invention relates to a method for computer aided design, the system therefore and a medium storing the method, more particularly relates to the method, the system, and the medium which provide calculating distances between elements mounted on each surface of a printed circuit board.

2. Description of the Related Art

A calculation of a distance between elements mounted on each surface of a printed circuit board (PCB), can make it possible to evaluate influences of noise caused by a possible creepage discharge. The distance is measured along the surfaces, the distance is referred to as the creepage distance hereinafter, and the distance should be evaluated whether to agree or not with requirements in specifications and/or standards.

The layout of elements formed or arranged on PCBs is usually designed with a computer aided design system, hereinafter referred to as CAD system. In case of use of the CAD system, the creepage distance can be calculated by a function of the CAD system, where the creepage distance is a distance measured along a surface of a PCB between an element mounted on a front surface of a PCB, the element is referred as to the front element hereinafter, and other element mounted on a rear surface of the PCB, the other element is referred as to the back element. And the resultant creepage distance is judged or evaluated whether it agrees or not with the requirements.

A conventional measurement is explained in detail with referring to FIGS. 19A and 19B, where FIG. 19A is perspective view and FIG. 19B is a side view. A distance LA between a front element 710 and a side 712 of a front surface 702 of a PCB 700, a thickness LC of the PCB 700, a distance LB between a back element 720 and the side 712 are measured respectively. And then a creepage distance between the two elements is gained by summing the distances LA and LB and the thickness LC. However, a following consideration on the path to measuring the distance is necessary in case of particular locations of the elements.

As shown in FIGS. 20A and 20B, a pair of elements 710 and 720, each of them being arranged on both surfaces of the PCB 700, normal lines NA and NB can be overlapped as shown in FIG. 20B. In this case of the locations of elements 710 and 720, the creepage distance can be gained as the method described above. However, in case of locations of elements 710 and 730, there is no common normal line being normal to the side 712. In this case, an operator must estimate a point α which gives the minimum sum of the distances DA and DB, where DA is a distance between the element 710 and the point α and DB is a distance between the element 730 and the point α. The selection of the point α is subjectively estimated and selected by the operator. The creepage distance, in this case, is given by the sum of DA, DB and the thickness LC of the PCB 700. Thus on the CAD system, a function to calculating a distance of two points selected by the operator is provided. The operator can gain the creepage distance by use of the function.

Other method of calculating of the creepage distance is disclosed in a Japanese publication of unexamined application 2005-10835. The method in the publication is disclosed as a function in an insulation-evaluating system. The system itself comprises a process transforming a three dimensional model to a correspondent approximate polyhedron model, a process of topologically recognizing the polyhedoron model, a process of recognizing a relation with adjacent parts, a process of recognizing and creating data of voltage system, a process of extracting a pair of voltage systems including a problem by rough check, a process of calculating "a creepage distance" between both the voltage systems, a process of checking the creepage distance by the information in a specification for insulation, and a process of outputting the information of the voltage systems including problems.

In the prior art shown in FIGS. 19A, 19B, 20A, and 20B, the creepage distance is obtained as the summation of the thickness of the PCB and the distances calculated by a computer between a turning point and points on the front and back elements, where these three points should be indicated by the operator. Thus till obtaining a result, the method in the prior art requires frequently operation by the operator, and imposes on the operator the serious burden and requires a long time. Further, the resultant creepage distance is not guaranteed as the path having the minimum distance between both elements, because the turning point and the points on the front and back elements are subjectively selected by the operator. Therefore, the method in the prior art involves a problem that the resultant distance as a creepage distance has serious error and a low reliability.

Furthermore, it is necessary to obtain all creepage distances for every possible combinations of a plurality of elements arranged on the both surfaces of PCB. Therefore, it will be vast time to calculate the every creepage distances even if the turning point and the points on the front and back element are set automatically instead of the operator, because the combination of the points for calculating the creepage distances are enormous. Subsequently to detecting front and back element not compatible with the requirement in the specification or a standard, the similar calculation must be repeated after the rearrangement of the front elements by the operator so that the elements become to be compatible with the requirement. Therefore, the prior art has problems such that the method imposes serious burden on the operator and requires a vast time for a whole design process.

In the method disclosed in the Japanese publication of unexamined application 2005-10835, the calculation of the creepage distance requires the process of transforming the three dimensional model to a correspondent approximate polyhedron model and so on. The calculation in the process of transforming and the like are too vast to obtain the creepage distances between the front and back element on the PCB. The disclosed method in the application is suitable for analyzing a object having a complicate structure. In case of an object having a simple structure such as a rectangular contour of PCBs, it is desired to obtain in a short time the distances between elements on the PCB by a simple calculation such as summation of a distance from an element to a side of the PCB, the thickness of the PCB, and the distance from the side to other element.

SUMMARY OF THE INVENTION

The present invention is provided to solve the problems described above. The present invention is capable of detecting accurately the elements between which a creepage distance should be calculated, and of improving the time for processing the calculation of the distances. Furthermore, the object of the present invention is to provide a computer aided design system capable of accurately calculating the creepage distances in a short time.

According to one aspect of the present invention, there is provided a method for supporting design of a printed circuit board for mounting a plurality of elements disposed on both the major surfaces of the printed circuit board, respectively, the method comprising, a step of creating a copy and a mirror copy of plan views of the major surfaces of the printed circuit board, respectively, a step of performing a calculation for obtaining a shortest straight line distance between one of the elements appearing in the copy and another of the elements appearing in the mirror copy when the copy and the mirror copy are placed side by side across a null thickness of the printed circuit board; and a step of obtaining a creepage distance between the two elements, the creepage distance being equal to a summation of a value of the thickness and a value of the shortest straight line distance.

According to another aspect of the present invention, there is provided an apparatus for supporting design of a printed circuit board for mounting a plurality of elements disposed on both the major surfaces of the printed circuit board, respectively, the apparatus comprising: means for creating a copy and a mirror copy of plan views of the major surfaces of the printed circuit board respectively, the copy and the mirror copy being placed side by side across a null thickness of the printed circuit board; means for calculating a creepage distance between one of the elements appearing in the copy and another of the elements appearing in the mirror copy, the creepage distance being equivalent to a summation of a distance and a thickness of the printed circuit board, the distance being a shortest straight line distance, the shortest straight line distance being between the one of the elements appearing in the copy and the another of the elements appearing in the mirror copy; and means for extracting the one of the elements appearing in the copy, the one of the elements appearing being within the creepage distance from the another of the elements appearing in the mirror copy, the creepage distance being less than a predetermined distance.

According to still another aspect of the present invention, there is provided, a method for computer-aided design concerning this invention comprising a mirror copy procedure around a side of the PCB, where the PCB board has the width component, depth component, and board thickness component, and the procedure of calculating the shortest distance in a straight line between the back target element to be calculated on the back surface of the PCB and the element which is a mirror-copied, where it is supposed that there is nothing about the component of the direction of board thickness. And a calculating procedure for obtaining the creepage distance by the summation of the shortest distance in a straight line and the thickness of the PCB. Thus, the distance in a straight line between the back target element and the mirror copied element is obtained under the condition of the thickness od the PCB equal to zero, and then the creepage distance is obtained by adding the thickness disregarded of the PCB to the distance. Accordingly the creepage distance can be obtained correctly and quickly by calculating a creepage distance as a distance on a straight line.

According to yet another aspect of the present invention, there is provided a method for computer-aided design including a mirror copy procedure around a side of the PCB, where the PCB board has the width component, depth component, and board thickness component, and the procedure of calculating the shortest distance in a straight line between the back target element to be calculated on the back surface of the PCB and the element which is a mirror-copied, where it is supposed that there is nothing about the component of the direction of board thickness. And the method includes a procedure in which a creepage distance is obtained as the summation of the shortest distance in a straight line and the thickness of the PCB. The method further includes a procedure in which elements having a creepage distance within a predetermined distance are extracted. Accordingly, in the present invention, since the calculated creepage distance between a front element and a back target element is compared with the predetermined distance and the elements apart within a creepage distance less than the predetermined distance are extracted, the elements arranged incorrectly automatically and quickly can be specified.

According to yet still another aspect of the present invention, there is provided a method for computer-aided design comprising; a mirror copy procedure for mirror copying symmetrically a target element about a side of a board of a PCB to be calculate, the target element being on a front surface of the board, where the board has the width component, depth component, and board thickness component; a procedure of detecting a back element on a back surface of the board in a distance from a point on the mirror copied element, the distance being a distance subtracted the board thickness from a predetermined allowable distance, supposing that there is nothing about a board thickness component; a procedure of calculating a shortest distance in a straight line of the back element and the mirror copied element, and of adding the thickness to the shortest distance to obtain a creepage distance, supposing that there is nothing about the board thickness component; and, a procedure of extracting element within a distance less than the predetermined allowable distance. Thus, the creepage distance is found by using only the back target element which is in the distance subtracted the board thickness from the predetermined allowable distance from the point on the mirror copied element, supposing that there is nothing about the board thickness component. Accordingly, procedure for finding the creepage distance is performed only for specified elements not for all the back elements. Therefore, the method can avoid unnecessary calculation and extract quickly elements in incorrect arrangement.

According to above aspect of the present invention, there is provided the method comprising; when the element in the creepage distance less than the predetermined allowable distance is extracted, an intersection of the straight line from the mirror copied element to the back target element and a side of a board of a PCB is calculated as a turning point, and a procedure of outputting two line segments as a path to means for displaying, the two line segments comprising a first line segment from the target element to the point and a second line segment for the point to the back target element as a path; and, a procedure of displaying the path. Thus, the turning point is obtained by use of the mirror copied element, and the path is outputted to means for displaying, the path comprising the two line segments from the target element to the point and the point to the back target element, and the target element and the back target element are also displayed. Accordingly, a user grasps which element is incorrect arrangement easily, even can grasp the path associated with the incorrect arrangement. When a plurality of paths are displayed, the element in severe incorrect arrangement can be grasped especially as incorrect arrangement.

The present invention also provides a computer-aided design system comprising; means for obtaining an element mirror-copied from a first element, the first element disposed on one of two surfaces of a printed circuit board, the element mirror copied and the first element being symmetrical about a selected side of the printed circuit board; means for calculating a creepage distance between the first element and a second element disposed on other of the two surfaces, the creepage distance being equivalent to a summation of a distance and a thickness of the printed circuit board, the distance being a shortest straight line distance under a condition, the shortest straight line distance being between the element mirror-copied and the second element, the condition being a null thickness of the printed circuit board; and means for extracting the second element, the second element being within the creepage distance from the first element, the creepage distance being less than a predetermined distance

BRIEF DESCRIPTION OF THE DRAWINGS

FIGS. 2A to 2F show data table structures concerning the embodiment of the present invention;

DESCRIPTION OF THE PREFERRED EMBODIMENTS

The preferred embodiments are explained with reference to FIGS. The present invention can be realized in various embodiments. Therefore, the present invention should not be recognized within the following embodiments. The explanation is directed to the system, while the present invention can be embodied also as a program to be able to be used in a computer or as a method by, so-called, the person skilled in the art. The present invention can be embodied as hardware, software, or combination of software and hardware. The program can be stored in a hard disk, a compact disk ROM, a digital video disk ROM, an optical magneto storage device, magnetic storage device, and a computer readable medium. Further, the program can be stored other computer via a network.

Figure 1:
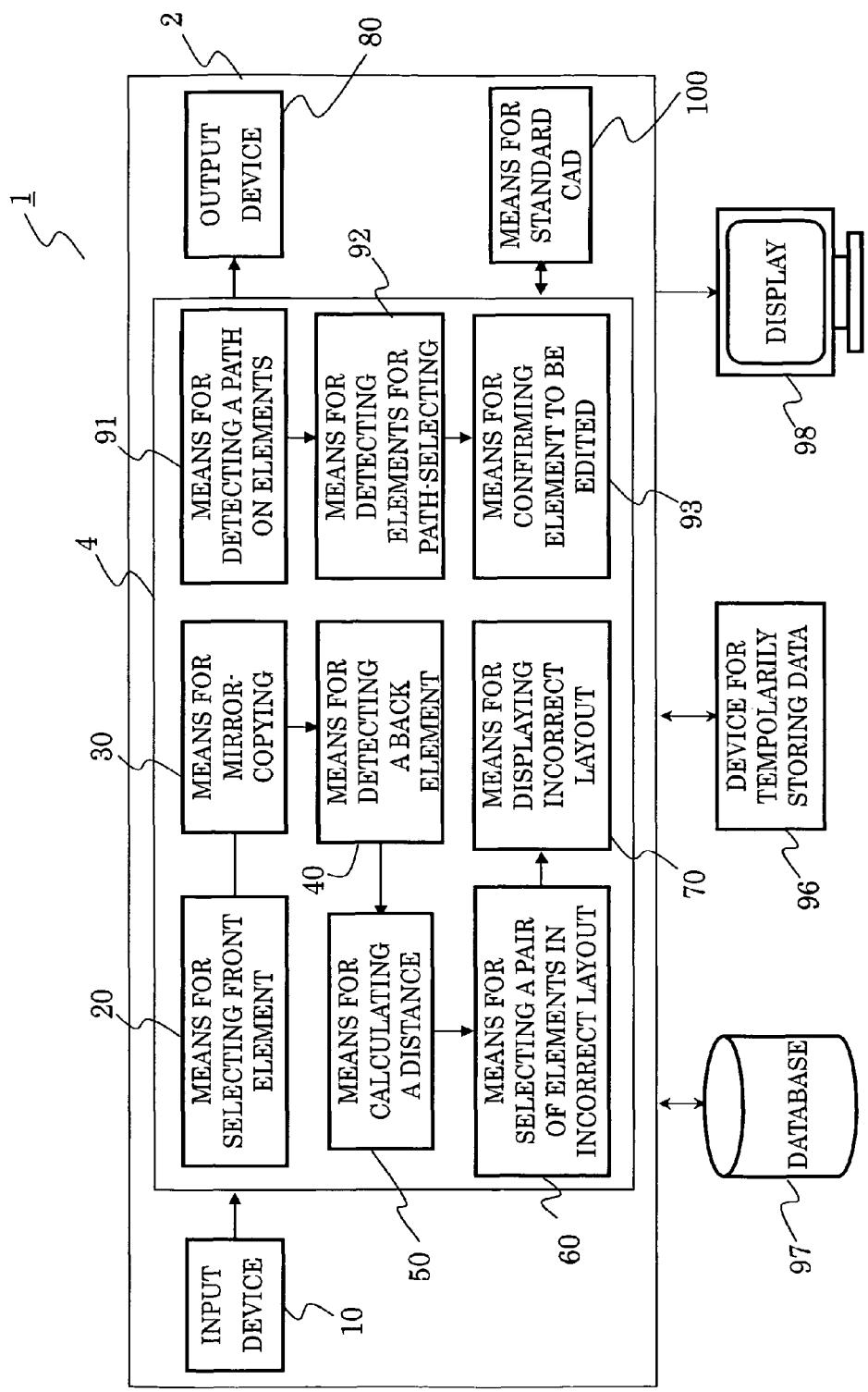
FIG. 1 shows schematically a block diagram showing the configuration of a printed circuit board design support apparatus of the present invention.

A preferred embodiment of the present invention is shown in FIG. 1 as a computer-aided design system (CAD system) 1. In FIG. 1, essential parts of the CAD system 1 are shown as a block diagram, and the system 1 may be embodied with a digital computer such as a personal computer or a work station. The CAD system 1 comprises a standard CAD system 100, an input device 10, a means for selecting a front element 20, a means for mirror-copying 30, a means for selecting back element 40, a means for calculating a distance 50, a means for selecting a pair of elements in incorrect layout 60, a means for displaying the pair in incorrect layout 70, an output device 80, a means for detecting a path on elements 91, a means for detecting element defining the path 92, a means for confirming element to be edited 93. The standard CAD system 100 can perform functions of enlargement, reduction, rotation, and the like which are used in designing a PCB, and the explanation on the standard CAD system 100 is abbreviated, because it is well-known, and is properly realized by various technologies.

The input device 10 reads out data for designing a figure, such as a board, elements disposed on the PCB, dimensions of the board, from a storage device such as a device for storing temporal data 96, a database 97, or the like. And the input device 10 can receive data, such as data for designing a figure, from the standard CAD 100. And then the input device 10 sends the data to the means for selecting a front element 20, the means for mirror-copying 30, the means for selecting back element 40, the means for calculating a distance 50, the means for selecting a pair of elements in incorrect layout 60, the means for displaying the pair in incorrect layout 70, the means for detecting a path on elements 91, the means for detecting element defining the path 92, the means for confirming element to be edited 93.

FIG. 2 A to FIG. 2F show schematically formats of data stored in a database 97 for the CAD system 1 for designing a PCB in the embodiment. FIG. 2A shows the format of common data 310, such as the thickness of the PCB 312, the predetermined allowable distance 314, and the attribution 316 of storage location of the data such as the thickness and the allowable distance. FIG. 2B shows the information of the board 320 to be calculated. The format of the information of the board 320 includes each attribution of the identification code 322 assigned to a shape of the board of the PCB to be calculated, the identification data 324 for identifying contour or hole, and the shape data 326 of the board. The "contour" in the attribution of the identification data 324 shows a side in the external shape, and the hole shows the side of the hole formed within the board. FIG. 2C shows the information regarding a front element to be calculated concerning to a side. The format of the information 330 includes each attribution of the identification code or the code 332 for discrimination, the identification code of the mirror-copied element 334, the name of net in circuit 336, and the shape data of the mirror-copied element 338. The database includes a table for all front elements, the table has each attribution of the identification data, the name of net in circuit, and the shape data of front element.

FIG. 2D shows the information for the back elements 340, as objects for calculating, which are detected on the basis of the shape of the mirror-copied element. The information includes each attribution of the identification code of the back element 342, the name of net 344 in a circuit, and the shape data of the back element 344. The database includes also a table for all back elements, the table has each attribution of the identification data of the back element, the name of net in circuit, and the shape data of back element. In this embodiment, the table for resultant calculation as shown in FIG. 2E includes each attribution of the identification codes of front elements 352 and back elements 354, the calculated creepage distance 356, and the path information 358. The table 360 shown in FIG. 2F includes the attribution of the initial points 362 and the terminal points 364 and the geometrical data of the calculated path 366.

Figure 3:
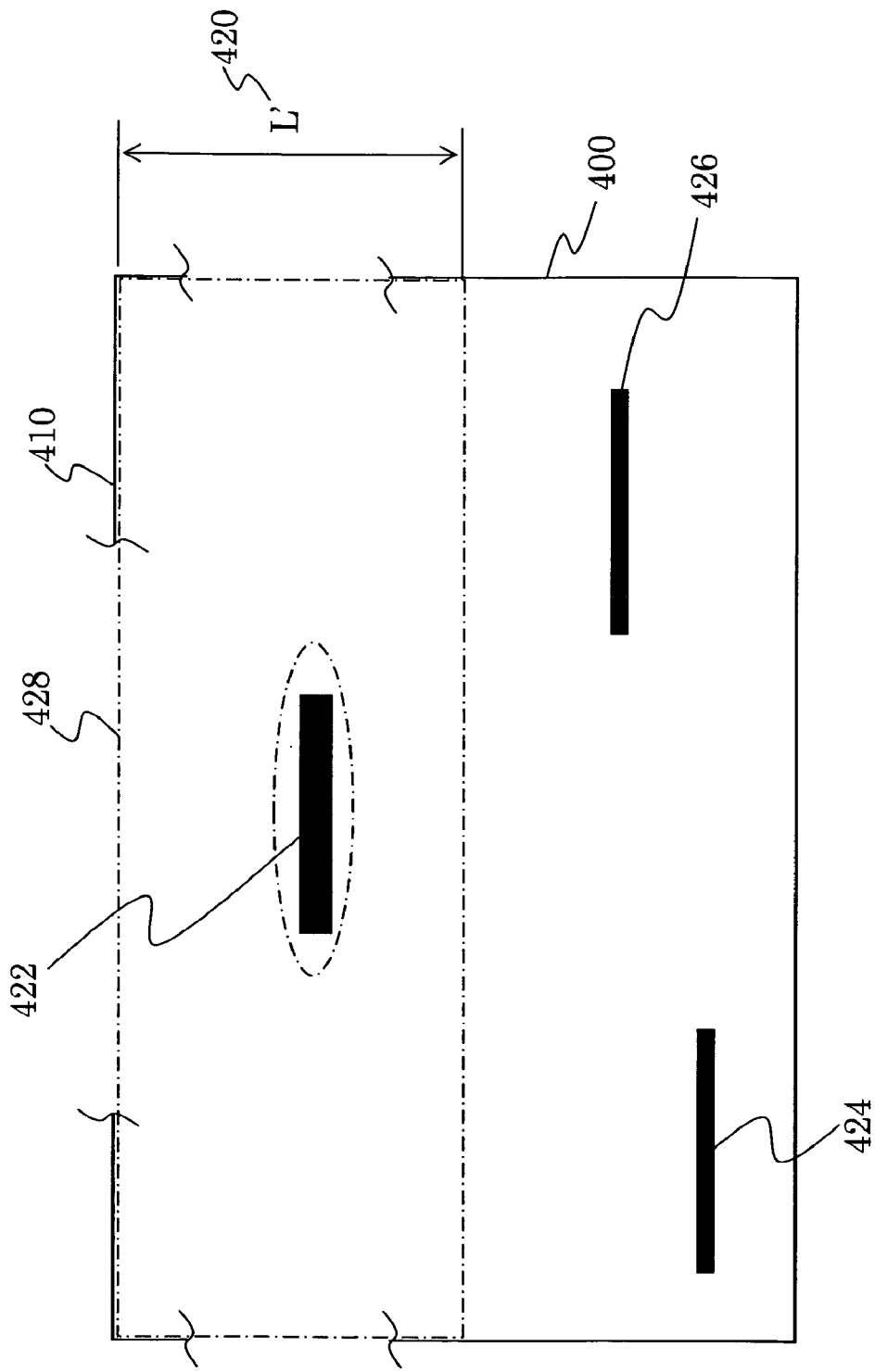
FIG. 3 shows a diagram of selection of the front element concerning the embodiment of the present invention.

The means for selecting the front element 20 has a function which selects element possibly not to be compatible regarding the creepage distance with a requirement in a specification or a standard, where the element has been arranged on the surface as the front one selected from the both surfaces of the board. In detail, one side of the board is selected, and then the elements located within an modified allowable distance normal to the side are detected, where the modified allowable distance is the allowable distance minus the thickness of the board 312 in FIG. 2A. FIG. 3 shows a diagram for explanation of selecting a front element based on the embodiment. The area within the modified allowable distance L' 420 in normal direction to a side 410 of the board 400 is shown as a rectangle 428 drawn with a dash-single dot line. Among the front elements 422, 424, 426, the front element 422 is selected as the front target element by the means for selecting the front element 20, because only the front element 422, hereinafter referred as to the front target or target element 402, is located within the rectangle 428, where the front target element 422 is enclosed by an ellipse drawn by a dash-single dot line.

Figure 4:
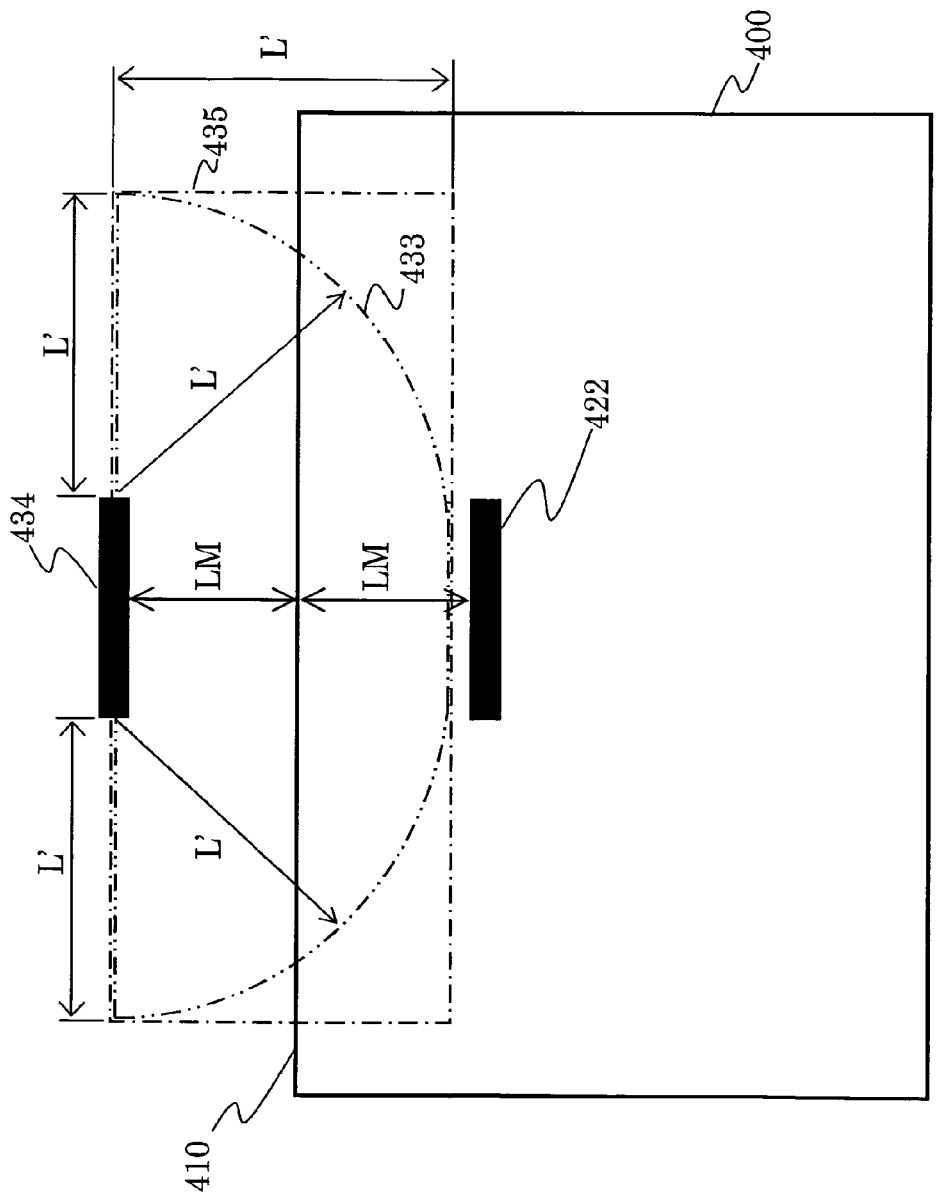
FIG. 4 shows a diagram of a mirror coping of the front element concerning the embodiment of the present invention.

The means for mirror-copying 30 has a function creating an image of a turned over element associated with the front element around a side of the board as a symmetrical axis for turning over. The image, hereinafter referred as to the turned over element or the mirror copied element, is symmetrical with the front target element 422 around the side. FIG. 4 shows a diagram for explanation of mirror-copying a front target element 422 based on the embodiment. The shape design data sent from the input device 10 (FIG. 1) includes the shape data of the board 400 and the element shape data of front target element 422. By the function of the means for mirror-copying 30, the element shape data of the turned over element (mirror copied element 434) is obtained based on the target element shape data selected by the means for electing the front element 20. In the FIG. 4 the front target element 422 and the mirror copied element 434 are apart LM from the side 410 and L' shows the modified allowable distance.

Figure 5:
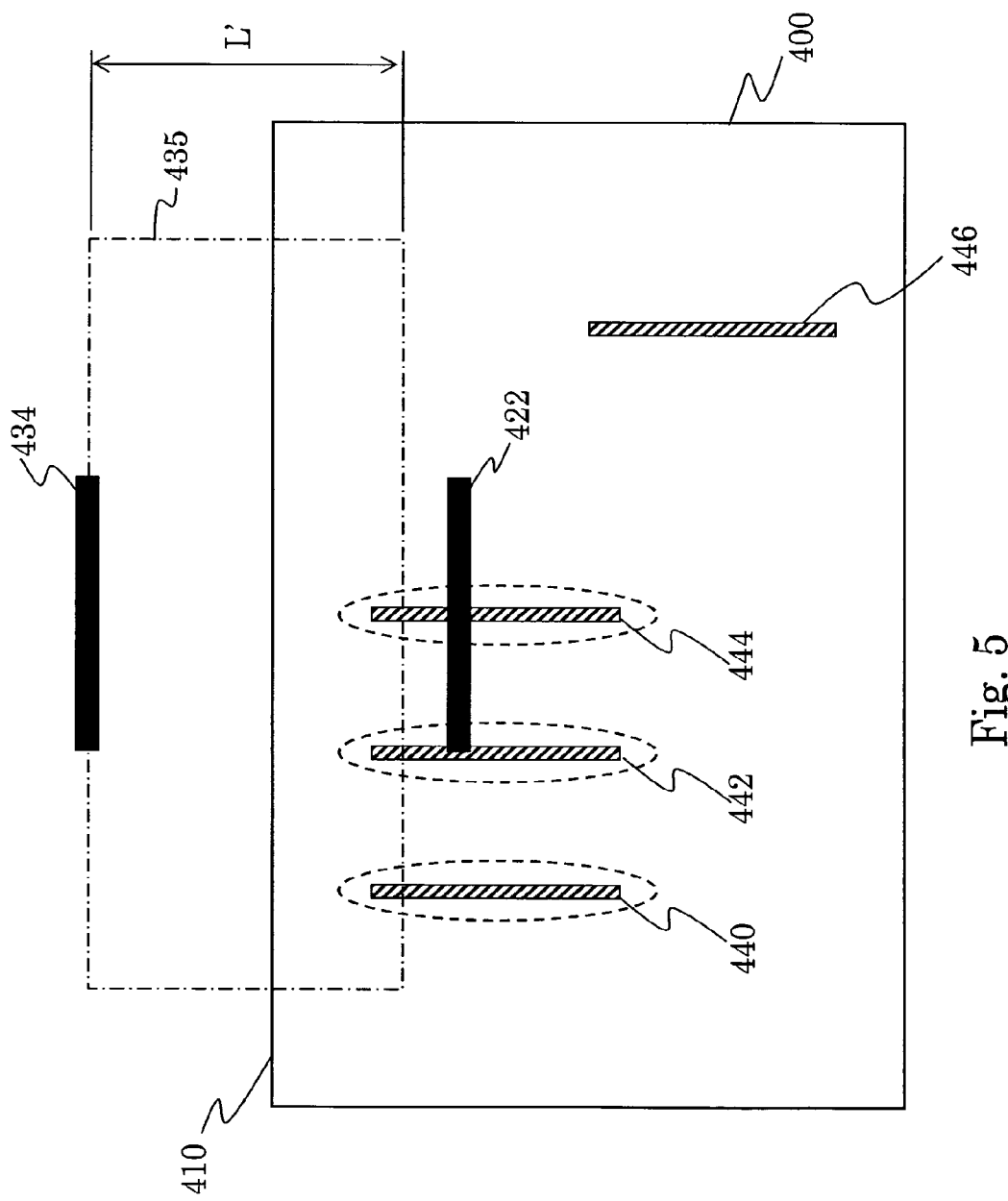
FIG. 5 shows a diagram of selection of the back target element concerning the embodiment of this invention.

The means for selecting back element 40 has a function which selects the back element, which are arranged on the back surface of the board, possibly not to be compatible regarding the creepage distance with a requirement in a specification or a standard. An area including back target element to be detected is obtained, because the means for mirror-copying 30 specifies the mirrored target element and the modified allowable distance L' is known. FIGS. 4 and 5 show diagrams for explanation of selecting a back element based on the embodiment. The area 435 to be searched, which is drawn with a dash-single dot line in FIG. 4, is ranging from the mirror copied element 434 to the modified allowable distance L' in directions of west, east, and in direction toward to the board 400. Further for more accurate area, the area 433 drawn with the dash-double dots line can be selected as the area to be searched. The means for selecting back element 40 detects as the back target elements back elements 440, 442, and 446, which are cross-hatched and enclosed with each ellipse drawn with broken line, since they have an intersection with the area 435 as shown in FIG. 5.

Figure 6:
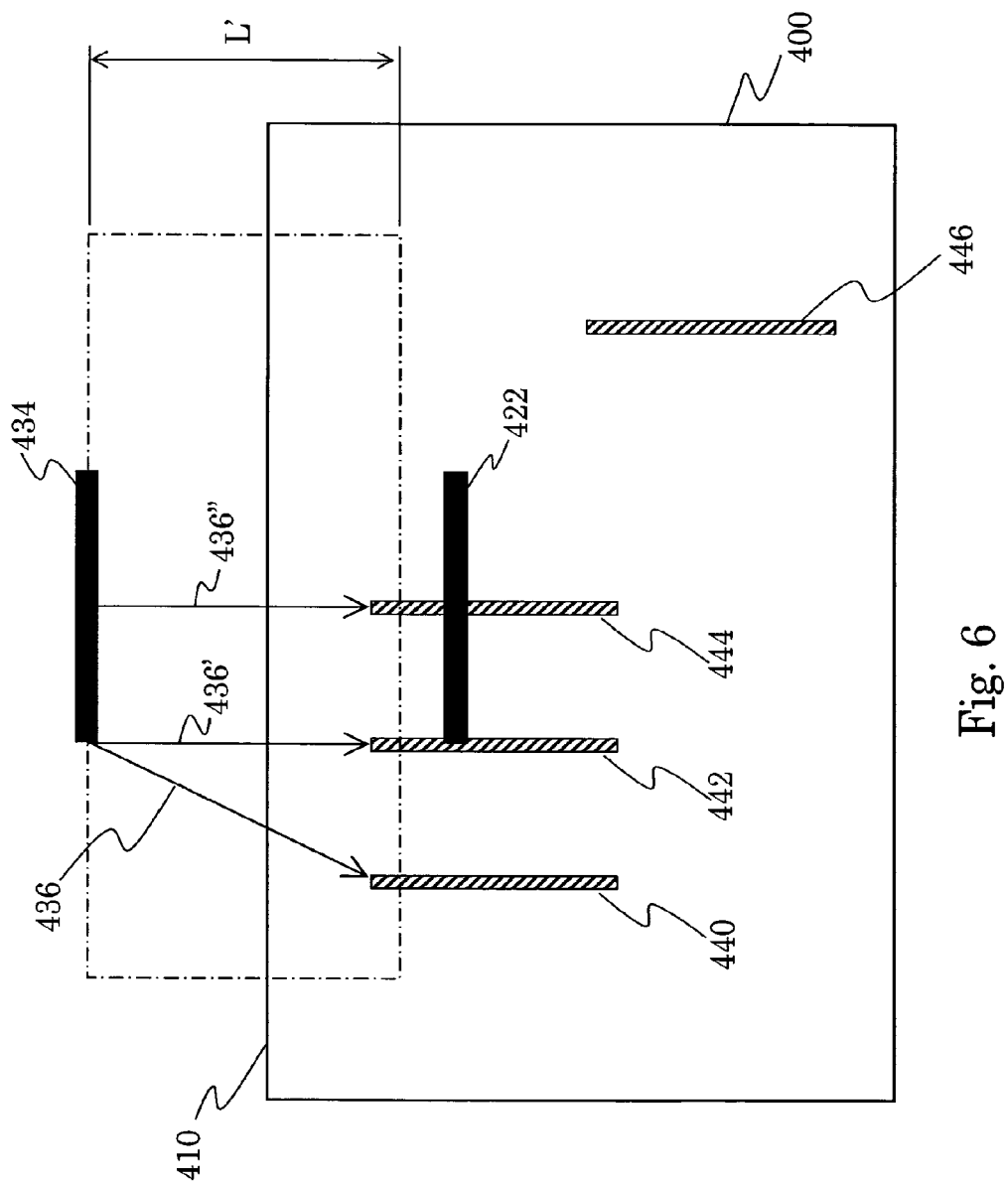
FIG. 6 shows a diagram of the creepage distance calculation concerning the embodiment of the present invention.

The means for calculating a distance 50 has a function which calculates the minimum distance from the mirror copied element 434 to the back target element. FIG. 6 shows a diagram for explanation of calculating a creepage distance based on the embodiment. Each minimum distance between one mirror copied element 434 to three back target elements 440, 442, 446 is shown with the arrows respectively. The means for calculating a distance 50 calculates each distance shown by the arrows 436, 436', 436" and adds the value of the thickness of the board 400 to the each value of the distance to obtain the respective creepage distance. Each element such as 440, 442, 446, and 446 has in detail a predetermined area. For example, in case of the conductive pattern for use of electrical connection, the area can be defined with two straight lines and two circular arc of a half circle. The algorithm to obtain the minimum distance between two area having each region described above is well know to design and realize a method to calculate the minimum distance between two area by a skilled person in the art. However the present embodiment uses the method described below, from the view point of a high speed processing. And the method is not well known. At first, the area of one of the elements is transformed into a segment. And the minimum distance between the other area and the segment is calculated by use of the well known algorithm. Or the area regarding two element are transformed into each segment, and the minimum distance between the two elements is calculated by use of the well known algorithm. Furthermore by use of the well known algorithm, it is possible to obtain the minimum distance between each end of the segment and the area of the other element or the segment obtained by transforming the other area.

The means for selecting a pair of elements in incorrect layout 60 has a function which compares the allowable distance and the creepage distance obtained by the means for calculating a distance 50. Comparing the two distances, the front target element and the back target element is decided as a pair of elements not compatible with requirement in a specification or a standard if the creepage distance shorter than the allowable distance.

Figure 7:
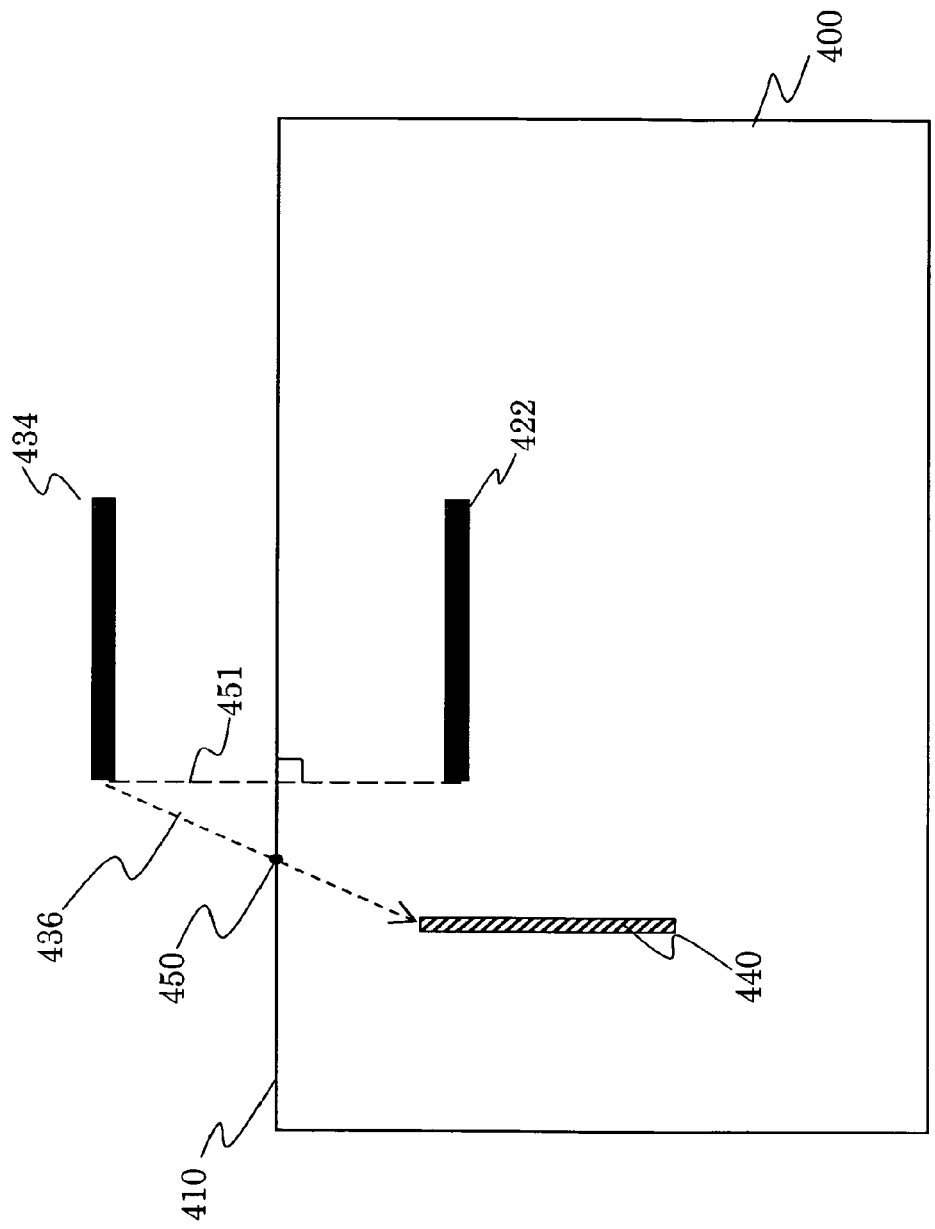
FIG. 7 shows a diagram of the path of the element group concerning the embodiment of the present invention.
Figure 8:
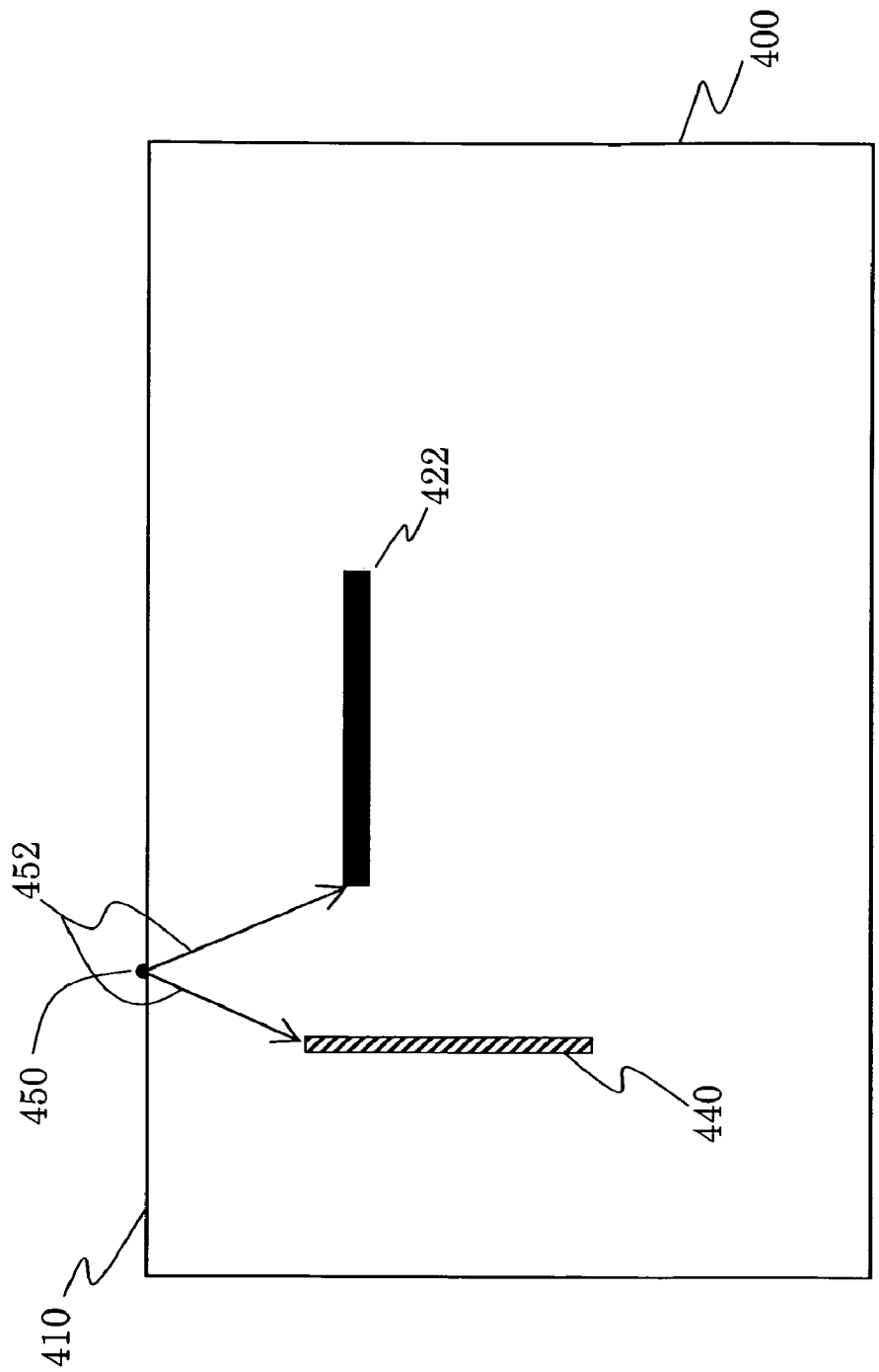
FIG. 8 shows a diagram for deriving the path of the element group concerning the embodiment of the present invention.

The means for displaying the pair in incorrect layout 70 has a function which obtains a path between a pair of the target element and back target element detected by the means for selecting a pair of elements in incorrect layout 60. FIGS. 7 and 8 show diagrams for explanation of deriving a path in the embodiment. In detail, the intersection of the path 436 and the side 410 of the board 400 is obtained as a turning point 450, where the path 436 corresponds to the minimum straight line distance of the mirror copied element 434 and the back target element 440. And the point on both the path 436 and the mirror copied element 434 is obtained. And next, an intersection of the straight line 451 and the front target element 422 is obtained, where the straight line 451 crosses the point on the mirror copied element 434 and is normal to the side 410. The intersection also can be analyzed by the calculation for mirror copying the front element around the side 410 as a symmetrical axis, because the intersection is corresponding to the point on the mirror copied element 434. As a result, the line is obtained as a path 452 in FIG. 8, where line crosses the point on the back target element 440, the turning point 450, and the point on the front target element 422.

The output device 80 outputs the data of the object side, such as the side 410, the front target element, such as 422, the back target element, such as 440, and the path, such as the path 452, which are obtained with the means for selecting a front element 20, the means for mirror-copying 30, the means for selecting back element 40, the means for calculating a distance 50, the means for selecting a pair of elements in incorrect layout 60, the means for displaying the pair in incorrect layout 70, the means for detecting a path on elements 91, the means for detecting element defining the path 92, the means for confirming element to be edited 93. The data is output to the means for displaying data, such as the display 98 in FIG. 1, a main memory device (not shown in FIG. 1), other storage device, such as the device for storing temporal data 96, or a printing device (not shown in FIG. 1).

The means for detecting a path on elements 91 has a function which searches figure data of the path to obtain the path passing the coordinate expressing the element. The means for detecting element defining the path 92 has a function which searches figure data to obtain the element indicated by the path. The means for confirming element to be edited 93 has a function which decides whether the element relocated by an operator is an element in incorrect layout or in proper layout.

The front and back surfaces of the board are apart each other at a distance of the thickness of the board. Therefore, each element arranged on the both surfaces has the different coordinate respectively in the direction of the thickness of the board. Usually, the reference of the direction of thickness is given at the back surface of the board, so the coordinate in the direction of the thickness of the back target element is zero, and the coordinate of the element on the front surface equals to the thickness of the board. Therefore, the neglect of the coordinate equivalent to the thickness of the board brings that each element arranged on the both surfaces of the board is considered on the same plane, such as the same surface of the board. Then the creepage distance between the front element and the back target element can be obtain as the summation of the distance between the mirror-copied element of the front element and the back target element and the thickness of the board. If the coordinate of one of the front or back surfaces is not zero but the front and back surfaces are parallel, it is possible to obtain the creepage distance can be obtain in the same manner described above.

Figure 9:
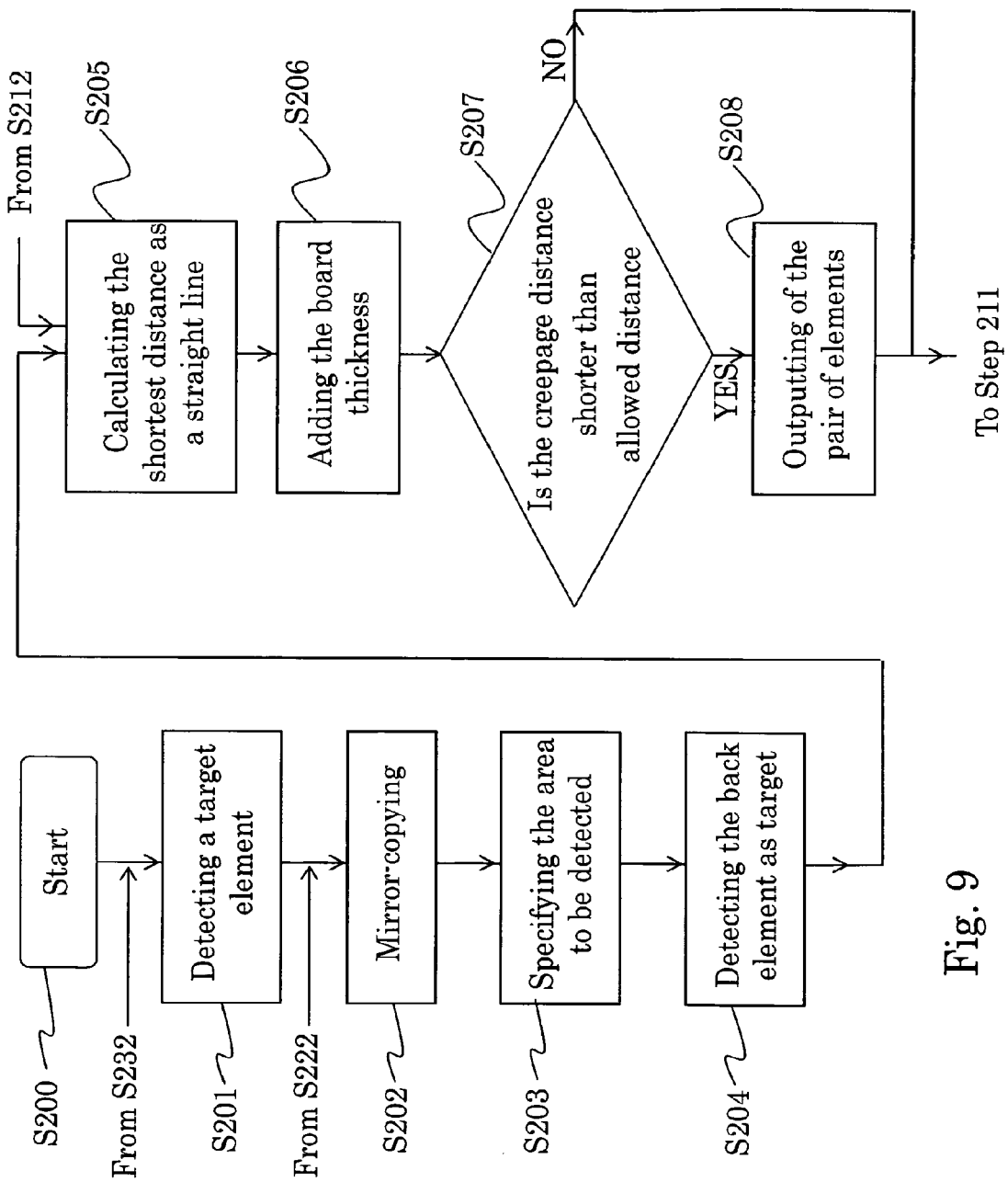
FIG. 9 shows a flowchart which shows an example of extracting processing of the incorrect arrangement of elements.
Figure 10:
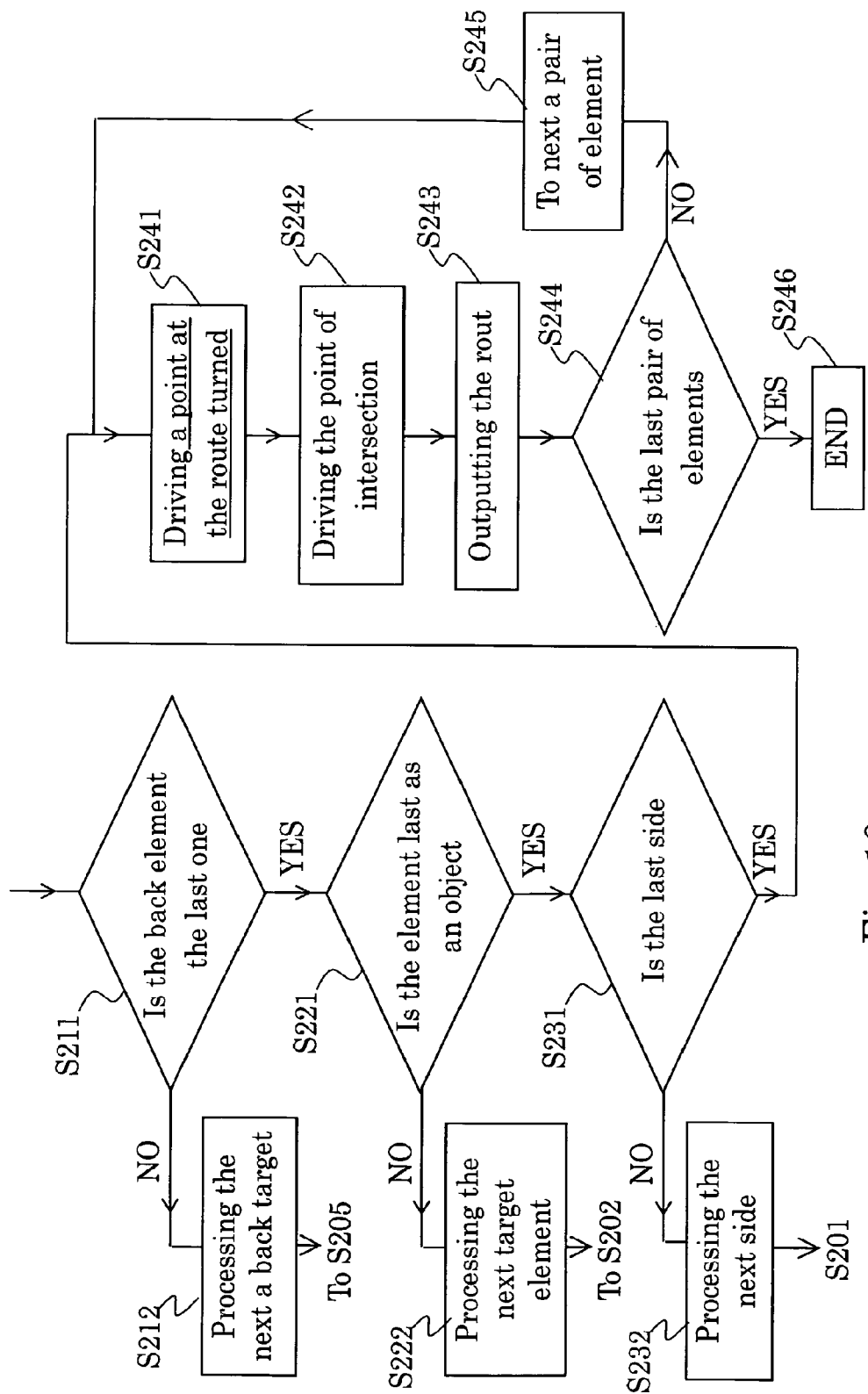
FIG. 10 shows a flowchart which shows an example of extracting processing of the incorrect arrangement of elements.

FIG. 9 shows an example of a flowchart of a process for selecting a pair of elements in incorrect layout. With referring to FIGS. 1 and 9, the process is explained. In the present embodiment, the process starts at Step 200 and begins substantially a process at Step 201. At Step 201, the means for selecting a front element 20 detects a front element placed within a region which occupies area within a distance equal to the allowable distance minus the thickness from the selected side of the board. When a plurality of the front elements are detected, the each identification code corresponding to the each front element is stored as a front target element in the device for temporarily storing data 96 in FIG. 1. And in Step 202, the means for mirror-copying 30 mirror-copies the front target element around the selected side as a symmetrical axis, where one of the front target elements is select in the case of the resultant plural front target elements. In Step 203, the means for selecting back element 40 specifies the mirror copied element and a region to be detected within the modified allowable distance from the mirror copied element. In Step 204, the means for selecting back element 40 detects as a back target element a back element within the specified region. When a plurality of the back target elements are detected, the each identification code corresponding to the each back target element is stored as the back target element in the device for temporarily storing data 96 in FIG. 1. In Step 205, the means for calculating a distance 50 calculates the shortest straight line distance from the mirror copied element to the back target element, where one of the back target elements is selected for the calculation if the back target elements are plural. And in Step 206, the means for calculating a distance 50 sums the thickness of the board and the shortest straight line distance to obtain the creepage distance. In Step 207, the means for selecting a pair of elements in incorrect layout 60 compares the obtained creepage distance with the allowable distance and decides whether the creepage distance is shorter than the allowable distance or not. In Step 207, the creepage distance is longer than the allowable distance, the process jumps to Step 211, while the output device 80 outputs the pair of the element to the memory in Step 208 in the case of the creepage distance being shorter than the allowable distance in Step 207 the process. And the process goes to Step 211.

In Step 211, it is judged whether the back target element is last the last one or not. When it is judged, in Step 211, the back target element is not the last in the case of the back target element detected in Step 204 being plural, other back target element is taken into as the back target element in Step 212, and then the process returns to Step 205. These steps can obtain every creepage distance for the all back target elements detected in Step 204 and can detect any pair in incorrect layout.

When in Step 211 it is judged that the back target element is the last one, the process goes to Step 221, where it is judge whether the target element processed in the Step 221 is the last one or not. When in Step 222 it is judged that the target element is not the last one in the case of the plural target elements being detected in Step 201, other target element is taken into as the target element and the process returns to Step 202. These steps can obtain every creepage distance for the all target elements and back target elements detected concerning a side of the board, and can detect any pair in incorrect layout.

When in Step 221 it is judged that the target element is the last one, the process goes to Step 231, where it is judged whether the side is the last one or not. Usually the board has at least four sides, then it is necessary to check whether there are any pair of the front and back elements in incorrect layout concerning to each of the sides. Therefore, in Step 231, when it is judged that the side is not the last one, other side is taken into as the side and the process returns to Step 201.

All the pairs of front and back elements in incorrect layout about the relation between the front and back surfaces on the PCB are extracted at the above Step 232. Next, it searches for one path at a time from these pair of front and back elements. First, the intersection of the target side of the board and the shortest straight line from the mirror copied element and the back target element, where the shortest straight line is one used to obtain the creepage distance, is obtained as a turning point (Step 241). Next, the means for displaying the pair in incorrect layout 70 identifies the point on the target element corresponding to the intersection of the shortest straight line and the intersection on the mirror copied element in Step 242. In Step 243, the output device 80 outputs the each data of the point on the back target element, the turning point, and the intersection on the target element. In Step 244, it judges whether it is the last pair of elements, if it is the last, the process will end, and if it is not the last, the process will return to Step 241 for the following pair of elements.

The information on the elements which are derived from the above process, such as the mirror copied element, the back target element, the creepage distance, the path exists on memory, and the output device 80 stores the information in the database. Although the derivation time of each information is sufficient as the timing of storing, it is more efficient to store the information on memory collectively.

The CAD standard means 100 receives the output of the pair of elements and a path, and specifies and displays on the PCB the front element, the path, and back element, where the a pair of the front and back elements is in a incorrect layout. Changing a color and displaying the front and the back elements which serve as incorrect layout compared with the elements used as correct layout, are displayed for example. Therefore a user can recognize that to display the path shows the pair of the elements in incorrect layout. Although the elements and the path is displayed on the display through the CAD standard means 100, the output device 80 can also display directly them on a display to specify them on the screen. Furthermore, the pair of elements in incorrect layout and the path concerning not all sides but a side which is specified by the user can be displayed on the screen to decrease the load to display them on the screen from a view point of processing in the output devices 80. Furthermore, the back target element in incorrect layout and the path concerning a target element specified by the user can be displayed, and the reduction of incidence of a display process also can be performed. When the user actually rearranges the surface element in incorrect layout, as described later, and just a display in the required range is enough.

Figure 11:
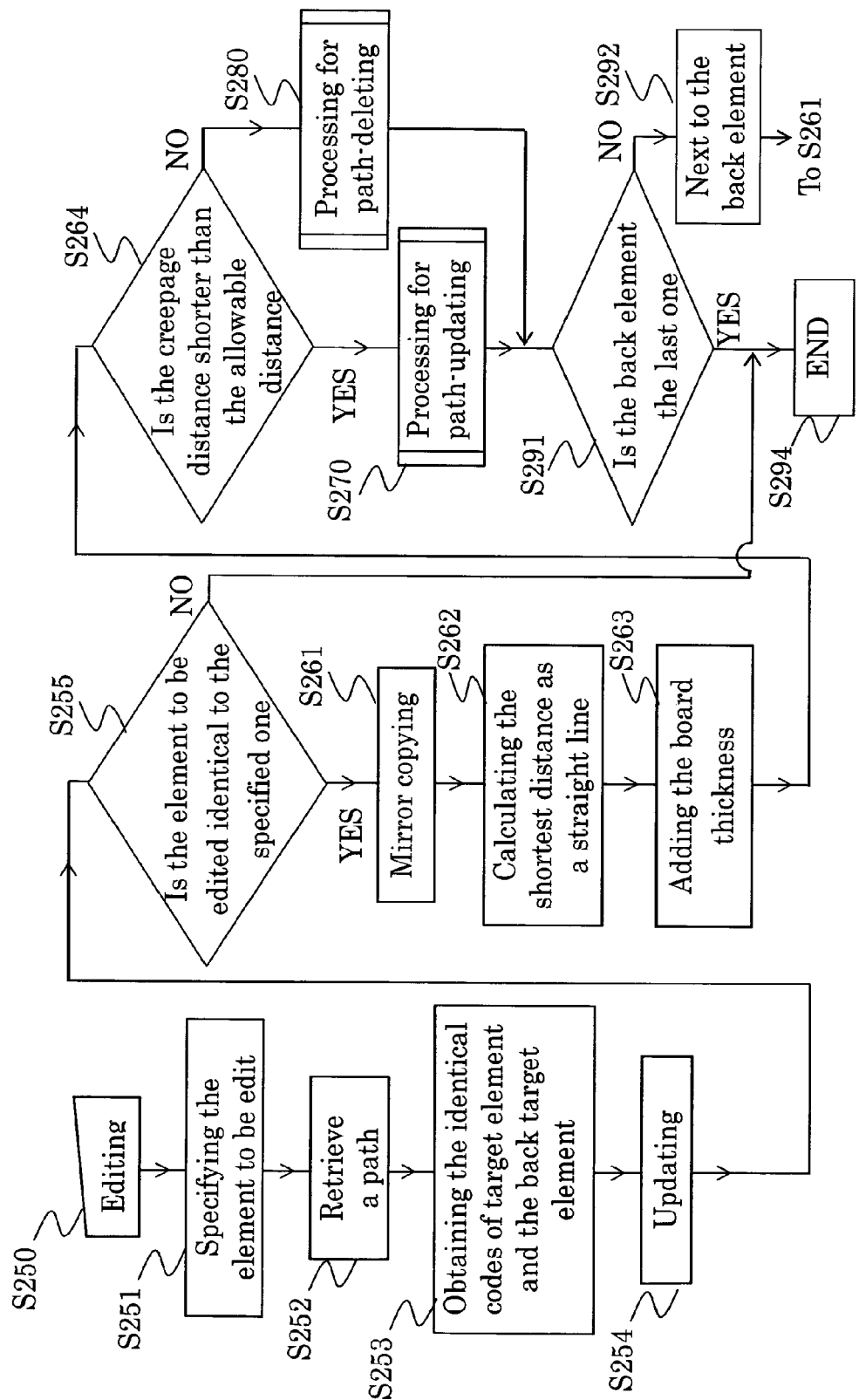
FIG. 11 shows a flowchart which shows an example of confirming processing of the incorrect arrangement component after relocation concerning the embodiment of this invention.
Figure 12:
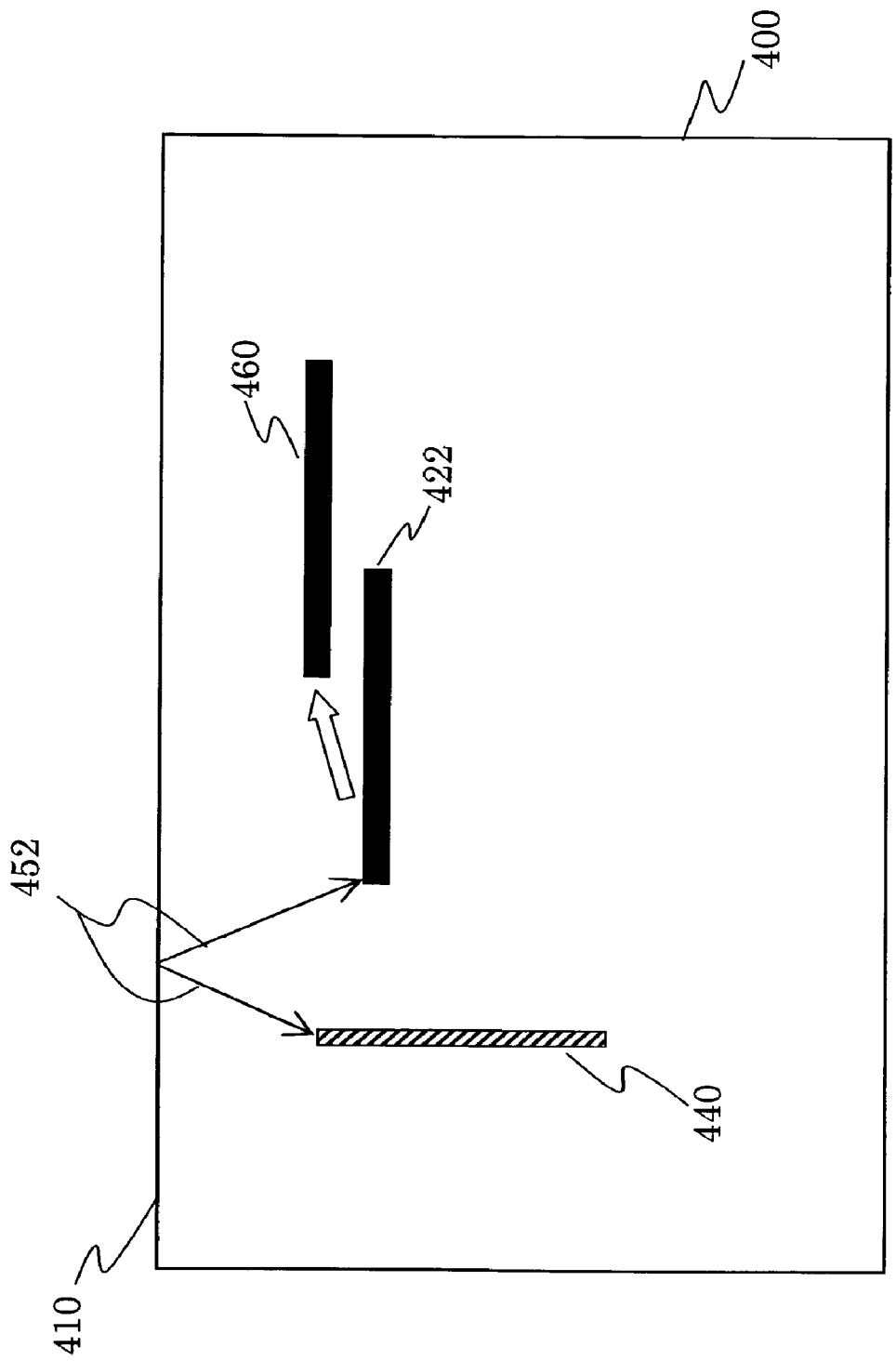
FIG. 12 shows a diagram showing the front element moved by edit concerning the present invention.

FIG. 11 is the flow chart which shows an example of the flow of the pair of elements in incorrect layout confirming processing after relocation in the embodiment of this invention. The user is able to edit an element, where the said pair of elements in incorrect layout component group and the associated path are displayed on the screen. In response to the editing operation from the user, the CAD standard means 100 performs a display change processing for migration of the element and CAD data changing. With treatment of the CAD standard means 100 in regard to the editing operation to the element, the creepage distance calculation is performed again, and the process is performed to confirm that the element remains in incorrect layout or not by a comparison with the allowable distance. Specifically, it is as follows. That is, the front element which serves as an editing element by the CAD standard means 100 in response to the editing operation starting in Step 250 by the user for the front element is specified first (Step 251). The means for detecting a path on elements 91 detects a path crossing the coordinate of the specified element (Step 252). ID of the element which the detected path indicates is detected from the graphic data of a path by the means for detecting element defining the path 92 (Step 253). In response to a user's editing operation, the CAD standard means 100 performs editing processing of the front element as an editing object (Step 254). For example, a front element 422 moves from the display of the state of FIG. 8, and it changes to the moved element 460 of the state of FIG. 12. ID of the target element moved by the means for confirming element to be edited 93 is judged whether the ID is in agreement with ID of the target element obtained at Step 253 (Step 255). When there is a plurality of element IDs, the process for the judgement is repeated.

The process ends when in Step 255 the means for confirming element to be edited 93 judges that the ID is not in agreement with ID of the target element obtained at Step 253. In the case of the target element crossing the path associated with other target element, the ID of the element obtained in the process of Step 253 may not agree with the ID of target element.

Figure 13:
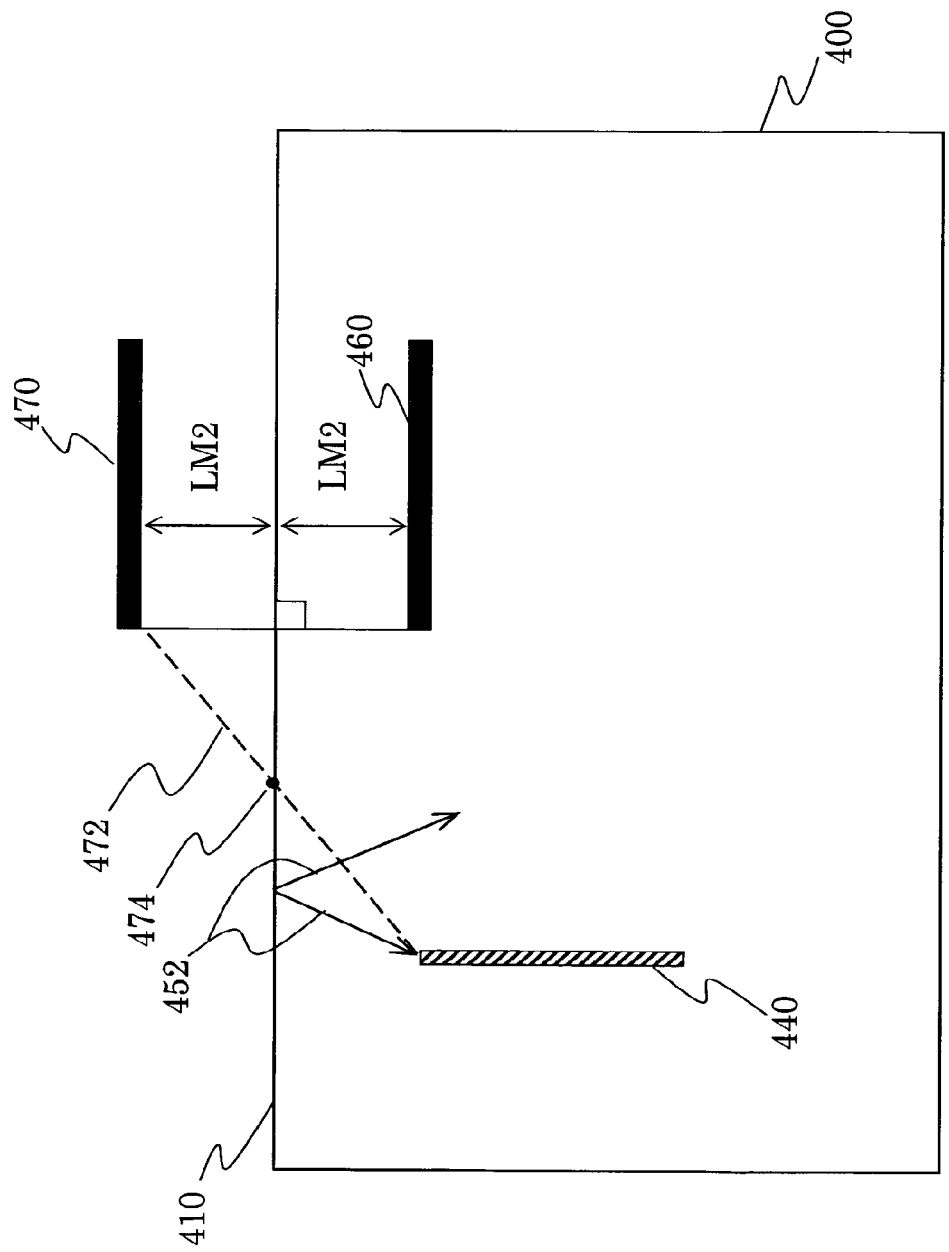
FIG. 13 shows a diagram of recalculation of the creepage distance.

When the means for confirming element to be edited 93 judges in Step 255 that the ID agrees with ID of the target element obtained, the mirror copying means 30 creates the mirror copied element 470 of the front element 460 centering on the side 410 (Step 261, and see FIG. 13). For example, it becomes as it is shown in FIG. 13 by the mirror copy of the front element 460 edit. The distance calculation means 50 calculates the shortest straight line distance 472 from the mirror copied element 470 to the back target element 440, where one back target element is chosen when there are a plurality of back element to be consider (Step 262). The distance calculation means 50 adds board thickness to the found shortest straight line distance, and finds creepage distance (Step 263). The creepage distance obtained by the means for selecting a pair of elements in incorrect layout 60 is compared with the allowable distance. In Step 264 it is judged whether the creepage distance is smaller than the allowable distance or not. In Step 264, if the means for selecting a pair of elements in incorrect layout 60 judges the creepage distance is shorter than the allowable distance, the process goes to a path update process which has been defined (Step 270). However, in Step 264, if the means for selecting a pair of elements in incorrect layout 60 judges the creepage distance is longer than or equals the allowable distance, the process goes to the path elimination procedure (Step 280) which has been defined.

Figure 14:
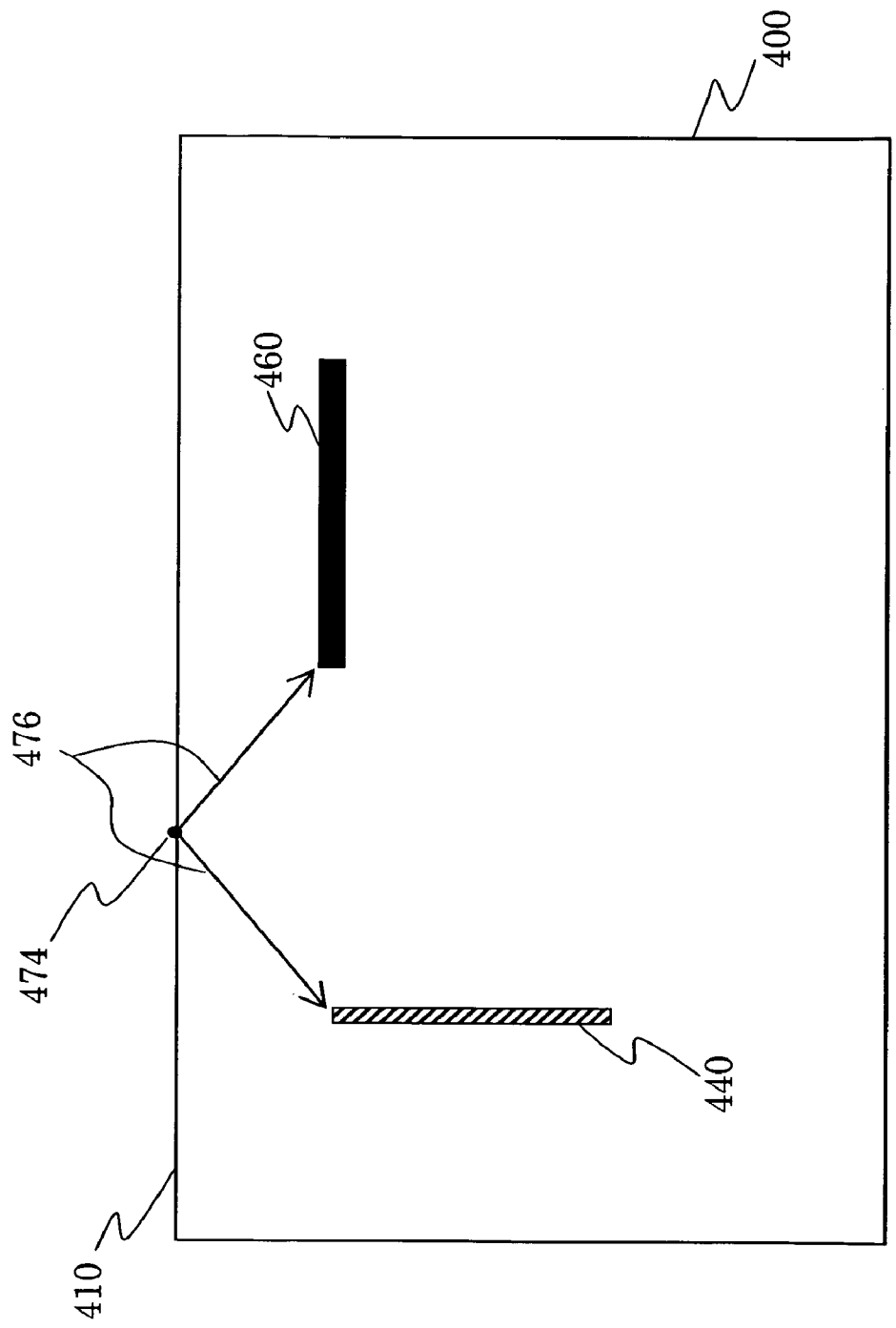
FIG. 14 shows a diagram of re-derivation of the path.

In a path update process (Step 270), treatment of said step 241 or Step 243 is made, a new path 476 is generated, and an old corresponding path is deleted. If change is reflected in a display through these treatment, it will become as it is shown in FIG. 14. In a path delete process (Step 280), an old corresponding path and a corresponding component group are deleted. The path on memory and a component group are updated, and also the information in a database is updated by the outputting part 80.

After termination of Step 270 or 280, it will be judge whether the back target element processed is the last back target element or not (Step 291). When it is judged that the back target element is the last one, the process ends and shifts under control of the CAD standard means 100. When it is judged at said step 291 that the back target element is not the last one, the process returns to Step 261 for the following back target element.

The path and the element specified by the path is not read from a database at Step 252 and Step 253, but the path and the element are specified from graphic data, because searching them from graphic data can process at high speed rather than obtaining through access to a database. However, the method realized by access to a database depending on the environment of the computer system to build may be able to process at high speed.

Figure 15:
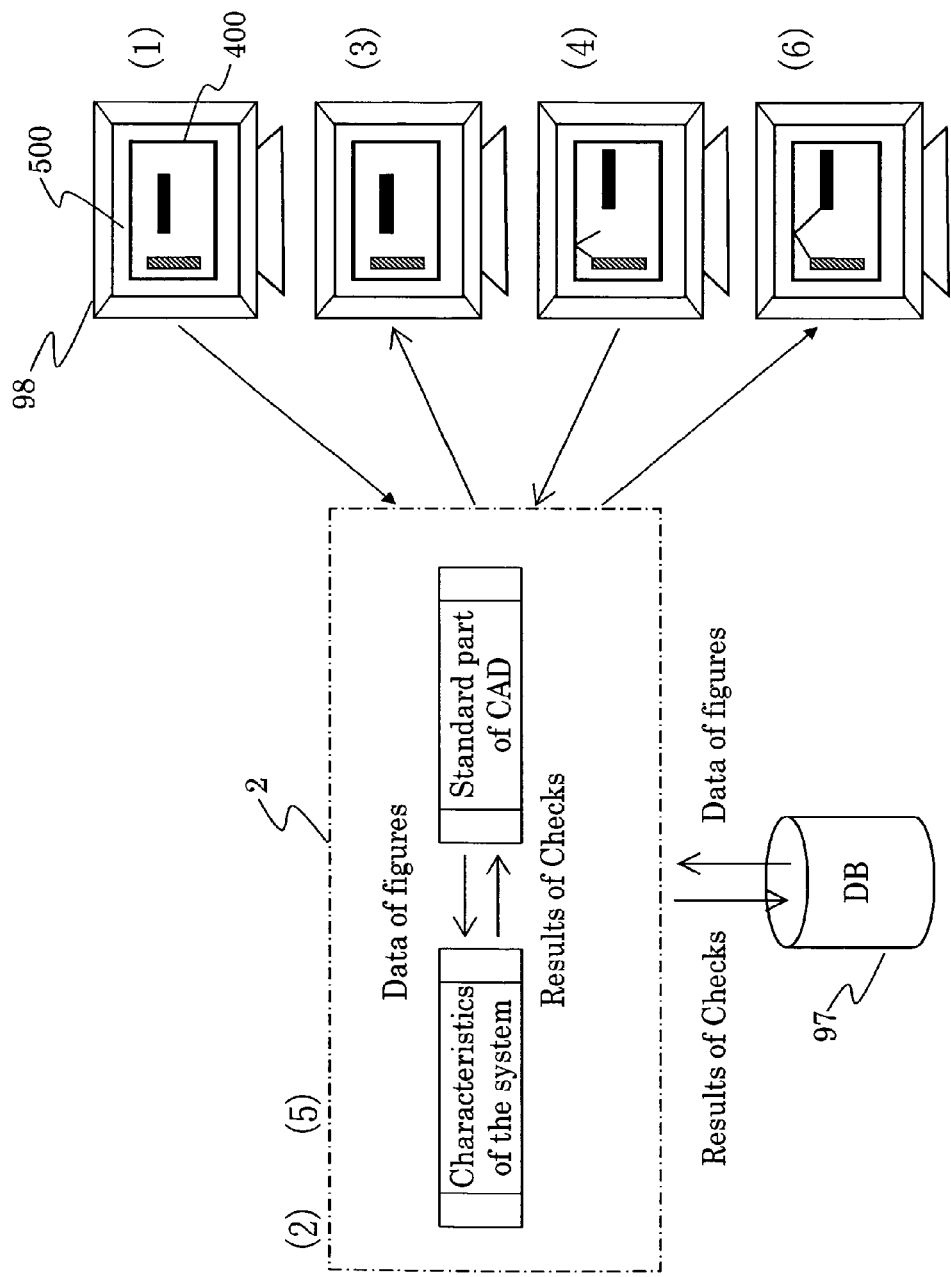
FIG. 15 shows an outline diagram of all the processes centering on operation of the user of the present invention.

FIG. 15 is an outline diagram of all the processes focusing on operations of a user. First, the user designs by performing an editing task, displaying graphic data 500 on the display 98 using the CAD standard means 100 ((1) in FIG. 15). The user directs measurement of creepage distance, and judgment of incorrect arrangement to the feature section of this invention after termination of the design ((2) in FIG. 15(2)). Creepage distance is found through the process which the feature section of this invention described above, the component of incorrect arrangement is extracted, and the path of the component of incorrect arrangement is calculated. And the path of the component of incorrect arrangement is displayed. To the display of the path, the user checks a resultant measuring and judges the need for revision ((3) in FIG. 15). In this task, when it is judged that there is no necessity for revision, the task ends. If there is the necessity for revision, the editing task of the PCB will be performed ((4) in FIG. 15). Usually, the position of parts, such as an electro-conductive pattern and an electric component, is changed, or the shape of an electro-conductive pattern is changed. The user directs re-measurement of creepage distance, and re-judgment of incorrect arrangement to the feature section of this invention after termination of design revision ((5) in FIG. 15). Accordingly, creepage distance is found through the process which the feature section of this invention described above, the component of incorrect arrangement is extracted, and the resultant update path of the component of incorrect arrangement is displayed. To the resultant display on the screen, the user reconfirms a resultant measuring and re-judges the need for revision ((6) in FIG. 15). The design of the PCB is completed by repeating the work of (4) to (6) in FIG. 15 if needed.

[On the target element] Also in the incorrect arrangement component confirming processing after edit, Step 203 and Step 204 can also be performed, and the creepage distances between the target element and all the associated back components can be found, and it can also be judged whether there is incorrect arrangement or not. In this embodiment, the creepage distance and the judge for the incorrect or correct arrangement only for the component indicated already by the path are performed from the viewpoint of the response performance of a system.

[Composition Other than the Composition Called if Needed by the Additional Function of the CAD Standard Means 100]

Although the system configuration that the feature section is called to the CAD standard means 100 is explained in this embodiment. But it is not necessary to compose a module division clearly to the CAD standard means 100 and a feature section, and the feature section of the present invention completely included in the CAD standard means 100 as well as the another module which constitutes the CAD standard means 100 can be realized.

[In the Case of the Surfaces of the PCB being not Parallel to the x-z Plane]

The system adopts the coordinate (x, y, z), where x component corresponds to the width component of the PCB, z-component corresponds to a depth component, and y-component corresponds to a board thickness, the surface of the PCB is parallel to the x-z plane. In this coordinate, the creepage distance can be obtained by neglect of the component of the thickness as described above. In the case of the x-z plane and the surface of the PCB being not parallel each other, the creepage distance can be similarly obtained by re-configurating in the xyz space which uses the width component of the PCB as x component for the component used for calculating the creepage distance, uses a depth component as z component, and uses a board thickness component as y component. The creepage distance calculation also with same otherwise also carrying out parallel projection of the component used for the creepage distance calculation to the surface or the back of the printed circuit board is applicable.

[An Element, the Side, a Circuit Network, and Limitation of the Range]

The target element is detected in this embodiment using the side and the distance which subtracted board thickness from the allowable distance, and the back target element is found by using the distance from the mirror copied element, where the distance is one subtracted the board thickness from the allowable. Furthermore, an element and the side can be limited. That is, the user specifies the element and the side to be checked, and the creepage distance can be found corresponding the element and the side, and it can be judged whether the element is in incorrect arrangement or not. In detail, the user can specify a certain front element, a certain back element, or a pair of a certain front and back elements, and a certain side. Thus, the user can search quickly the result by performing the each operation described above only for the elements and the side specified by the user without performing unnecessary operation.

Figure 16A:
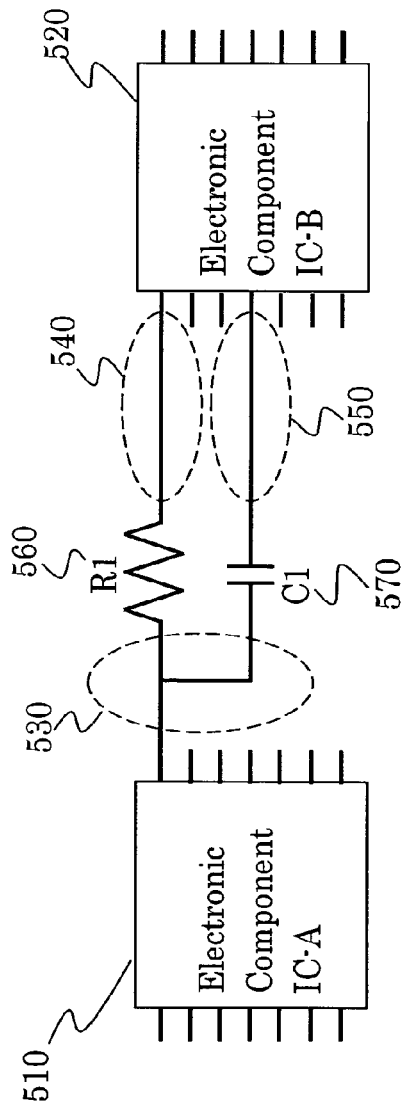
FIGS. 16A and 16B show diagrams of an example the circuit network concerning of the present invention.
Figure 16B:
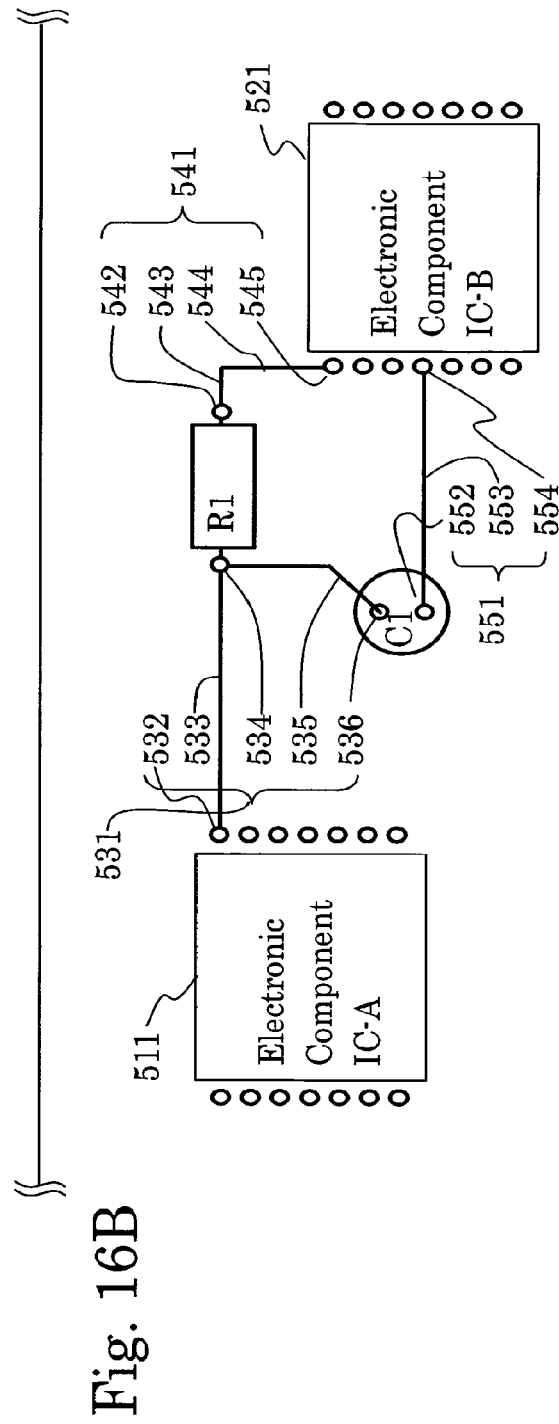

An element and the side can be specified and also the user can also specify a circuit network. The circuit network is formed when carrying out the logical design in which each of the contacting portions of parts, such as an electric element, is connected by wiring or electro conductive pattern. The user can decide a circuit net name. The potential within the wiring or the electro conductive pattern between the contacting portions of parts is same. A text file called a net list (there are various formats) may be created and employed. The net composition on a circuit is shown in FIG. 16A, where 530, 540, 550 show each circuit network. In a CAD system for designing a PCB, wiring between actual parts is carried out based on the information of logical connection between the parts designed by a CAD system for designing a circuit. FIG. 16 B shows the net composition on the PCB. Compared with FIG. 16A, physical composition understands easily by FIG. 16B. (b). In this FIG. 16B, the electro-conductive patterns 533, 535, 543, 544, 553 and the pads 532, 534, 536, 542, 545, 552, 554 are illustrated as elements. Moreover, only the elements within an area, for example a rectangle area, specified by the user can be calculated for the creepage distance, and it can also be judged whether the element is located in incorrect arrangement.

[In the Case of the PCB Having a Hole]

Figure 17:
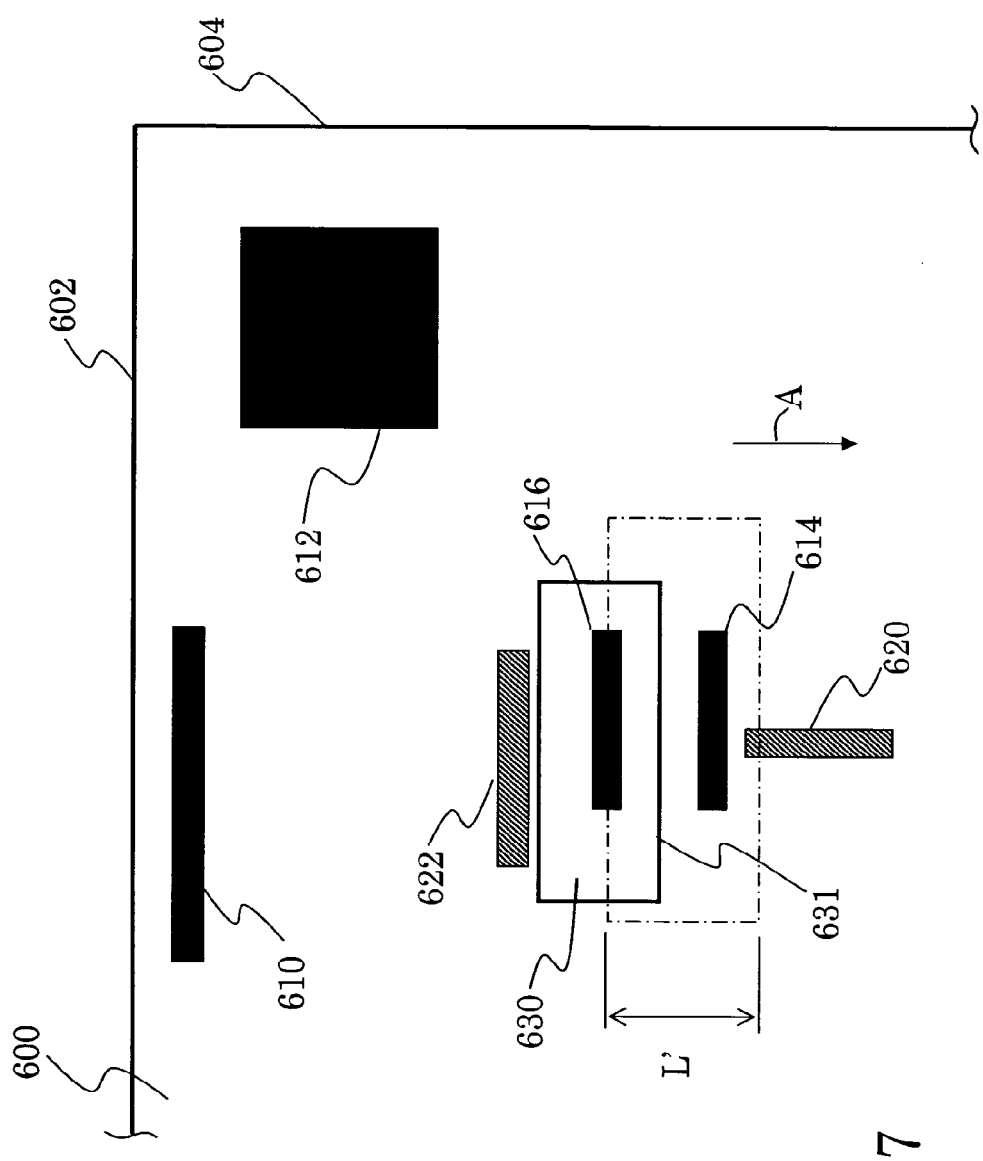
FIG. 17 shows a diagram of calculation of creepage distance in case a hole exists in the board concerning the present invention.

The side constituting the board is not restricted to the border of the outside of the PCB. As shown in FIG. 17, for example, the side 621 of a hole 630 formed within the PCB 600 is included in the sides to be considered. The creepage distance with the back element 620 detected as a back target element will be calculated by performing said each process of this embodiment to the front element 614 arranged near the hole 630. In this case, although the back component 620 and the back component 622 are arranged as the back elements near the hole, the back element 620 may become a back target element. This is because in the case the detection area of detecting the back target element is the range of the distance which is a distance L' of the allowable distance minus the thickness of the board in the direction of this side shown with an arrow A on the basis of the mirror copied element 616. By setting the area drawn with a dash-single dot line for detecting in this way, the incorrect calculation of the shortest distance in a straight line between a back element 622 and the mirror copied element 616 is not carried out, therefore incorrect extraction of a pair of the element in incorrect arrangement is not performed. When the allowable distance is large, the back element 622 may turn into a back target element, but it can prevent calculating the mistaken creepage distance by comparing the distance to a target element and a back target element with the distance from the front element to be mirrored to a back target element in such a case. Here, when finding the distance of a target element and the back target element w, the distance is found by adding the thickness of the board to the shortest distance in a straight line not including the thickness without using a mirror copying.

[How to Find Another Creepage Distance]

Figure 18:
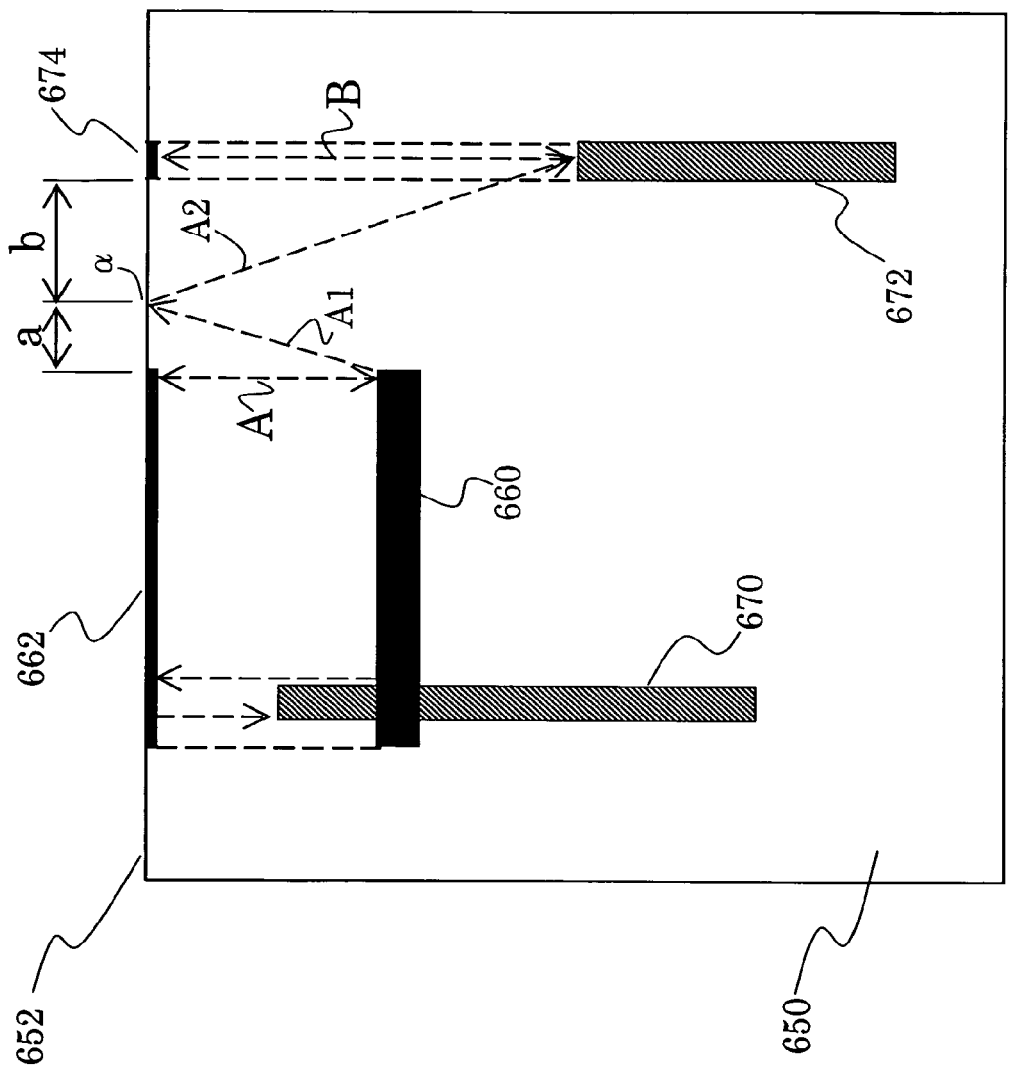
FIG. 18 shows a diagram of another method of calculation of creepage distance concerning the present invention.
Figures 19A, 19B:
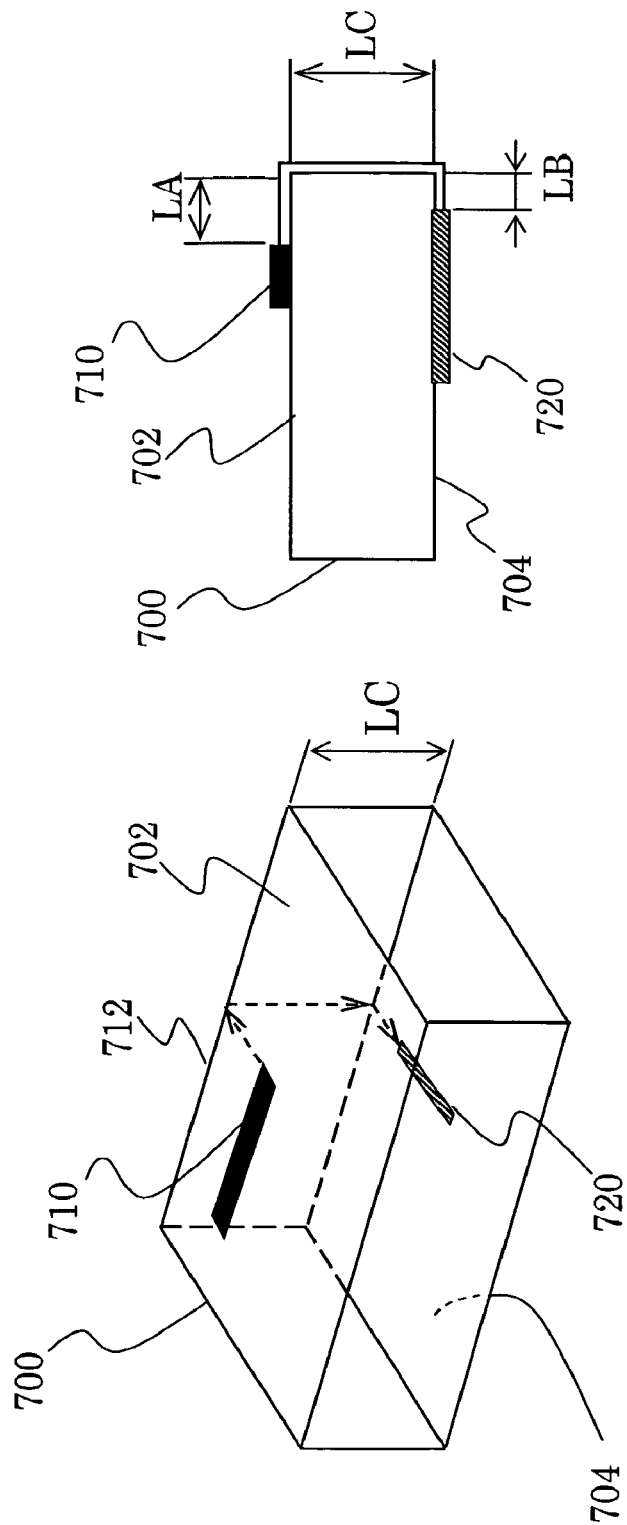
FIGS. 19A and 19B show diagram of calculation of the creeping distance in prior art.
Figure 20B:
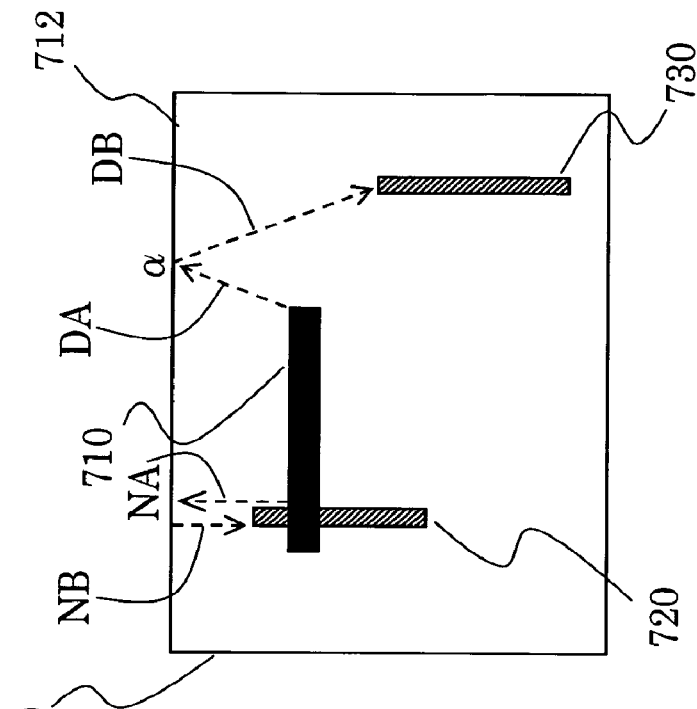
FIGS. 20A and 20B show diagram of calculation of the creeping distance in prior art.
Figure 20A:
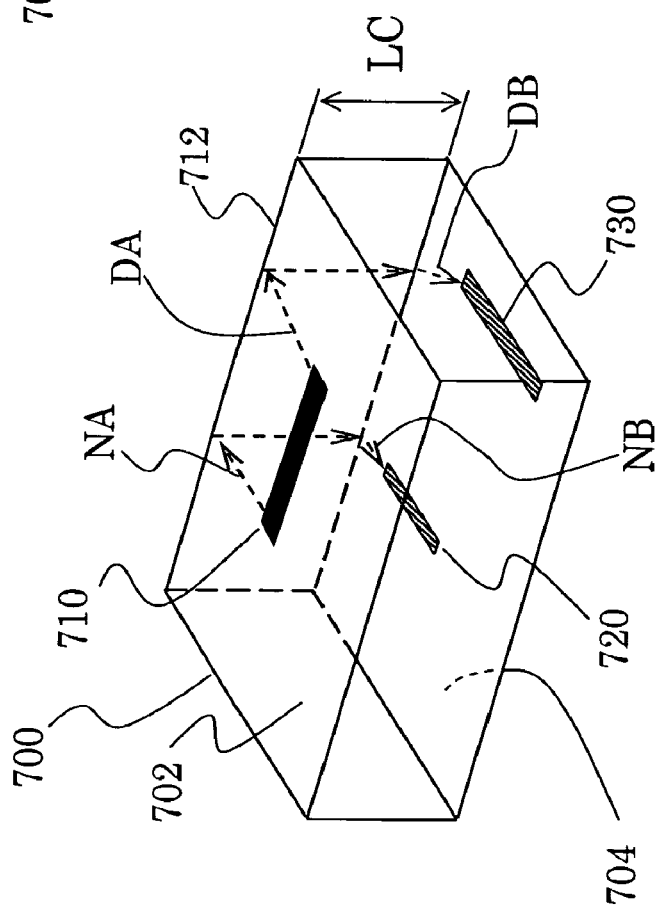

The board thickness is added to the shortest distance in a straight line of the mirror copied element to the back target element to find the creepage distance in this embodiment. However, as shown in FIG. 18, when a target element 660 and the back target element 672 do not exist on the same vertical line of the side of the PCB, it is possible to calculate the creepage distance as a following way. Neglecting the thickness of the board, the turning point α is selected, where the point α divides the segment between a segment into the ratio (A:B=a:b) of the distance A from the target element 660 to the side 652 of the PCB 650 and the distance B from the back target element 672 to the side 652 of the PCB 650, the segment is a straight line connecting the each end of the projected line segment 662 of the target element 660 to the side 652 and the projected line segment 674 of the back target element 672 to the side 652. The distance A1 from the target element 660 to the point α and the distance A2 from the point α to the back target element 672, where the thickness of the board also is neglected. And then the sum of A1, A2, and the thickness equals to the creepage distance. When the target element 660 and the back target element 672 on the back surface of the PCB 650 is normally projected on the side 652 and each of the line segments 662, 674 projected overlaps each other, the creepage distance is found by the method performed conventionally.

Although said each above embodiment explains the present invention, it is possible for the technical scope of this invention not to be limited to the range given in an embodiment, but to add various change or improvement to each embodiment. The embodiment including such change or improvement is also contained in the technical scope of this invention. This is clear also from claims.

What is claimed is:

1. A method executed by a computer for supporting design of a printed circuit board comprising:
   creating, by the computer, a first copy of a view of a first major surface and a second copy of a plan view of a second major surface of the printed circuit board respectively, the first copy and the second copy being placed side by side so that the first copy and the second copy contact each other, the printed circuit board being for mounting a plurality of elements disposed on the first major and the second major surfaces;
   obtaining a first line segment on a first side corresponding to a side of the printed circuit board, the first line segment being projected normal onto the first side from a first element, the first element being one of the elements appearing in the first copy; obtaining a second line segment on the first side, the second line segment being projected normal onto the first side from a second element, the second element being one of the elements appearing in the second copy;
   obtaining a third line segment, the third line segment being a line having two ends, one of the two ends being an end of the first line segment, another of the two ends being an end of the second line segment, the end of the first line segment and the end of the second line segment being adjacent each other;
   dividing the third line segment into a ratio of a distance from the first element to the first side and a distance from the second element to the first side;
   obtaining a point on the third line segment, the point dividing the third line segment by the ratio;
   calculating two distances, one of the two distances being from the first element to the point, the other of the two distances being from the point to the second element; and
   obtaining a creepage distance between the first and the second elements, the creepage distance being a sum of the two distances and a thickness of the printed circuit board.

2. An apparatus for supporting design of a printed circuit board comprising:
   a creator configured to create a first copy of a view of a first major surface and a second copy of a plan view of a second major surface of the printed circuit board respectively, the first copy and the second copy being placed side by side so that the first copy and the second copy contact each other, the printed circuit board for mounting a plurality of elements disposed on the first major and the second major surfaces;
   a first obtainer configured to obtain a first line segment on a first side corresponding to a side of the printed circuit board, the first line segment being projected normal onto the first side from a first element, the first element being one of the elements appearing in the first copy;
   a second obtainer configured to obtain a second line segment on the first side, the second line segment being projected normal onto the first side from a second element, the second element being one of the elements appearing in the second copy;
   a third obtainer configured to obtain a third line segment, the third line segment being a line having two ends, one of the two ends being an end of the first line segment, another of the two ends being an end of the second line segment, the end of the first line segment and the end of the second line segment being adjacent each other;
   a divider configured to divide the third line segment into a ratio of a distance from the first element to the first side and a distance from the second element to the first side;
   a fourth obtainer configured to obtain a point on the third line segment, the point dividing the third line segment by the ratio;
   a calculator configured to calculate two distances, one of the two distances being from the first element to the point, the other of the two distances being from the point to the second element; and
   a fifth obtainer configured to obtain a creepage distance between the first and the second elements, the creepage distance being a sum of the two distances and a thickness of the printed circuit board.

* * * * *